(12) United States Patent
Chen

(10) Patent No.: US 11,935,749 B2
(45) Date of Patent: Mar. 19, 2024

(54) METHOD OF MANUFACTURING SEMICONDUCTOR STRUCTURE

(71) Applicant: NANYA TECHNOLOGY CORPORATION, New Taipei (TW)

(72) Inventor: Tsung-Cheng Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 83 days.

(21) Appl. No.: 17/842,498

(22) Filed: Jun. 16, 2022

(65) Prior Publication Data

US 2023/0411154 A1 Dec. 21, 2023

(51) Int. Cl.
*H01L 21/02* (2006.01)
*H01L 21/027* (2006.01)
*H01L 21/308* (2006.01)
*H01L 21/3213* (2006.01)

(52) U.S. Cl.
CPC ........ *H01L 21/0274* (2013.01); *H01L 21/308* (2013.01); *H01L 21/3213* (2013.01)

(58) Field of Classification Search
CPC .......... H01L 21/0274; H01L 21/308; H01L 21/3213
USPC .................................. 438/637, 694, 700, 703
See application file for complete search history.

(56) References Cited

U.S. PATENT DOCUMENTS

| | | | |
|---|---|---|---|
| 11,651,965 B2* | 5/2023 | Liu | H01L 21/0335 438/700 |
| 2010/0244247 A1* | 9/2010 | Chang | H01L 21/76898 257/E21.585 |
| 2013/0034965 A1* | 2/2013 | Kim | H01L 21/28123 257/E21.232 |
| 2016/0079115 A1* | 3/2016 | Lee | H01L 21/76811 438/637 |

* cited by examiner

*Primary Examiner* — Duy Vu N Deo
(74) *Attorney, Agent, or Firm* — Muncy, Geissler, Olds & Lowe, P.C.

(57) ABSTRACT

The present disclosure provides a method of manufacturing a semiconductor structure. The method includes forming a first patterned layer over a substrate; forming a second patterned layer over the substrate and alternately arranged with the first patterned layer; performing an etching, thereby forming an arched surface of the first patterned layer and an arched surface of the second patterned layer; forming a sacrificial layer over the first patterned layer and the second patterned layer, wherein a plurality of air gaps are defined by the substrate, the first patterned layer, the second patterned layer and the sacrificial layer; removing the sacrificial layer above the plurality of air gaps, thereby forming a planar top surface of the first patterned layer and a planar top surface of the second patterned layer; and patterning the substrate using the first patterned layer and the second patterned layer as a mask.

20 Claims, 27 Drawing Sheets

METHOD OF MANUFACTURING SEMICONDUCTOR STRUCTURE

TECHNICAL FIELD

The present disclosure relates to a method of manufacturing a semiconductor structure. Particularly, the present disclosure relates to an improved technique for patterning processes.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of lithography across a wafer have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of forming a semiconductor structure. The method includes forming a first patterned layer over a substrate; forming a conformal layer over the first patterned layer; performing a blanket deposition thereby forming a second layer over the conformal layer; performing a first etching until the first patterned layer is exposed, wherein a portion of the second layer over the first patterned layer is removed by the first etching thereby forming a second patterned layer alternately arranged between portions of the first patterned layer; removing vertical portions of the conformal layer; forming a sacrificial layer over the first patterned layer and the second patterned layer, wherein a plurality of air gaps are defined between the first patterned layer and the second patterned layer; and performing a second etching until the plurality of air gaps are exposed.

In some embodiments, the method further includes forming a first layer over the substrate; and removing portions of the first layer, thereby forming the first patterned layer.

In some embodiments, the conformal layer is in contact with a top surface of the first patterned layer and a top surface of the substrate.

In some embodiments, the second layer is disposed over the first patterned layer and between portions of the first patterned layer.

In some embodiments, the second patterned layer includes portions of the second layer surrounded by the conformal layer.

In some embodiments, portions of the conformal layer disposed on a top surface of the first patterned layer are removed by the first etching.

In some embodiments, the second patterned layer is separated from the substrate by horizontal portions of the conformal layer.

In some embodiments, corner portions of the first patterned layer are removed concurrently with the removal of the vertical portions of the conformal layer.

In some embodiments, remaining portions of the first patterned layer include arched surfaces after the removal of the corner portions of the first patterned layer.

In some embodiments, corner portions of the second patterned layer are removed concurrently with the removal of the vertical portions of the conformal layer.

In some embodiments, remaining portions of the second patterned layer include arched surfaces after the removal of the portions of the second patterned layer.

In some embodiments, the first patterned layer includes a planar top surface after the second etching.

In some embodiments, portions of the second patterned layer include planar top surfaces after the second etching.

In some embodiments, a thickness of the conformal layer defines a width of the plurality of air gaps.

In some embodiments, a surficial portion of the first patterned layer is removed by the first etching.

Another aspect of the present disclosure provides a method of forming a semiconductor structure. The method includes forming a first patterned layer over a substrate; forming a second patterned layer over the substrate and alternately arranged with the first patterned layer; performing an etching thereby forming an arched surface of the first patterned layer and an arched surface of the second patterned layer; forming a sacrificial layer over the first patterned layer and the second patterned layer, wherein a plurality of air gaps are defined by the substrate, the first patterned layer, the second patterned layer and the sacrificial layer; removing the sacrificial layer above the plurality of air gaps, thereby forming a planar top surface of the first patterned layer and a planar top surface of the second patterned layer; and patterning the substrate using the first patterned layer and the second patterned layer as a mask.

In some embodiments, the first patterned layer includes a same dielectric material as the second patterned layer.

In some embodiments, the first patterned layer or the second patterned layer includes oxide.

In some embodiments, the sacrificial layer includes oxide.

In some embodiments, the method further includes forming a conformal layer over the first patterned layer prior to the formation of the second patterned layer.

In some embodiments, the conformal layer includes a dielectric material different from that of the first patterned layer or that of the second patterned layer.

In some embodiments, the conformal layer includes nitride.

In some embodiments, a total thickness of the second patterned layer and the conformal layer is substantially equal to a thickness of the first patterned layer.

In some embodiments, a thickness of the conformal layer is in a range of 5 to 30 nanometers.

In some embodiments, a thickness of the second patterned layer is less than a thickness of the first patterned layer.

In some embodiments, a pattern of the first patterned layer and the second patterned layer is transferred to a topmost layer of the substrate.

In some embodiments, a thickness of the first patterned layer is in a range of 50 to 300 nanometers.

In some embodiments, a width of one of the plurality of air gaps is in a range of 5 to 30 nanometers.

In some embodiments, the sacrificial layer is in contact with an entirety of the arched surfaces of the first patterned layer and the arched surfaces of the second patterned layer.

Another aspect of the present disclosure provides a method of forming a semiconductor structure. The method includes forming a first oxide layer over a substrate, wherein the first oxide layer includes an opening exposing the substrate; forming a nitride layer in the opening, wherein the nitride layer lines sidewalls of the first oxide layer and a portion of a top surface of the substrate in the opening; forming a second oxide layer in the opening, wherein the second oxide layer is separated from the substrate and the first oxide layer by the nitride layer, and top surfaces of the first oxide layer, the second oxide layer and the nitride layer are coplanar; removing a portion of the nitride layer lining the sidewalls of the first oxide layer, thereby forming a rounded top surface of the second oxide layer and a rounded top surface of the first oxide layer; forming a third oxide layer over the first oxide layer and the second oxide layer without filling a gap between the first oxide layer and the second oxide layer; and performing an etching until the gap is exposed, thereby forming a planar top surface of the first oxide layer and a planar top surface of the second oxide layer.

In some embodiments, the removal of the portion of the nitride layer includes a directional dry etch.

In some embodiments, the gap is at the portion of the nitride layer removed by the directional dry etch.

In some embodiments, the substrate is exposed through the gap between the first oxide layer and the second oxide layer.

In some embodiments, the method further includes removing a portion of a topmost layer of the substrate exposed in the gap.

In some embodiments, a material of the topmost layer is different from that of the first oxide layer or that of the second oxide layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
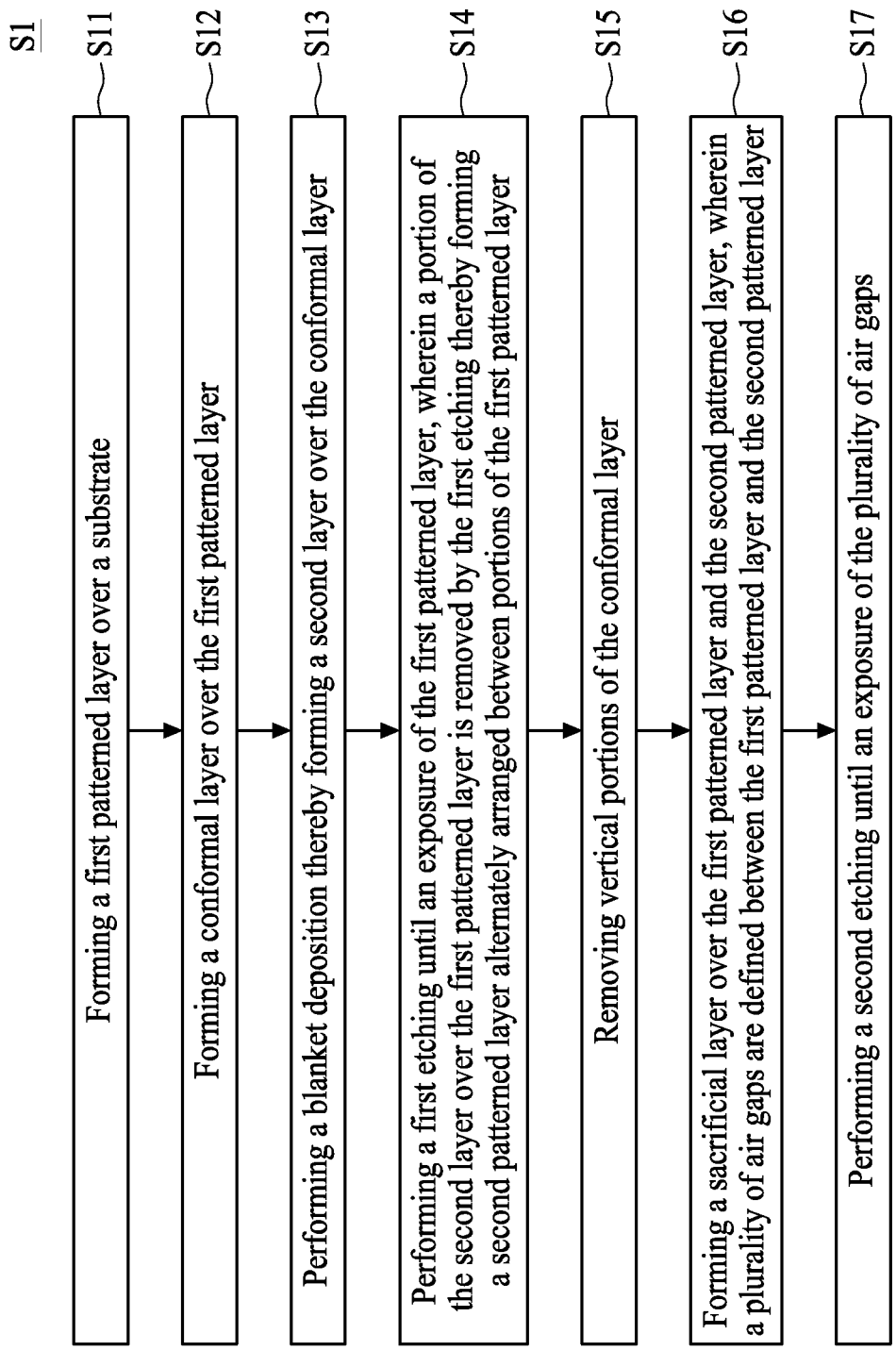
FIG. 1 is a flow diagram illustrating a method of manufacturing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has reached an advanced precision of photolithography. In order to further reduce device sizes, a double patterning technique has been developed in which multiple hard layers are patterned at a same elevation to compose one pattern to be transferred to a target layer. The multiple hard layers undergo multiple operations, such as deposition, etching, planarization and so forth, and the pattern formed by the multiple hard layers may have an uneven top surface after the multiple operations. The uneven top surfaces of the pattern result in an uneven etching result on the target layer. The present disclosure relates to a method for manufacturing a semiconductor structure. In particular, the method of the present disclosure is able to provide a planar surface of a pattern so as to avoid the uneven etching result. A performance of a device formed according to the method and a product yield can be thereby improved.

FIG. 1 is a flow diagram illustrating a method S1 for manufacturing a semiconductor device in accordance with some embodiments of the present disclosure. The method S1 includes a number of operations (S11, S12, S13, S14, S15, S16 and S17) and the description and illustration are not deemed as a limitation to the sequence of the operations. In the operation S11, a first patterned layer is formed over a substrate. In the operation S12, a conformal layer is formed over the first patterned layer. In the operation S13, a blanket deposition is performed to form a second layer over the conformal layer. In the operation S14, a first etching is performed until the first patterned layer is exposed, wherein a portion of the second layer above the first patterned layer is removed, and a second patterned layer is formed alternately arranged between portions of the first patterned layer. In the operation S15, vertical portions of the conformal layer are removed. In the operation S16, a sacrificial layer is formed over the first patterned layer and the second patterned layer, and a plurality of air gaps are defined between the first patterned layer and the second patterned layer. In the operation S17, a second etching is performed until the plurality of air gaps are exposed.

Figure 2:
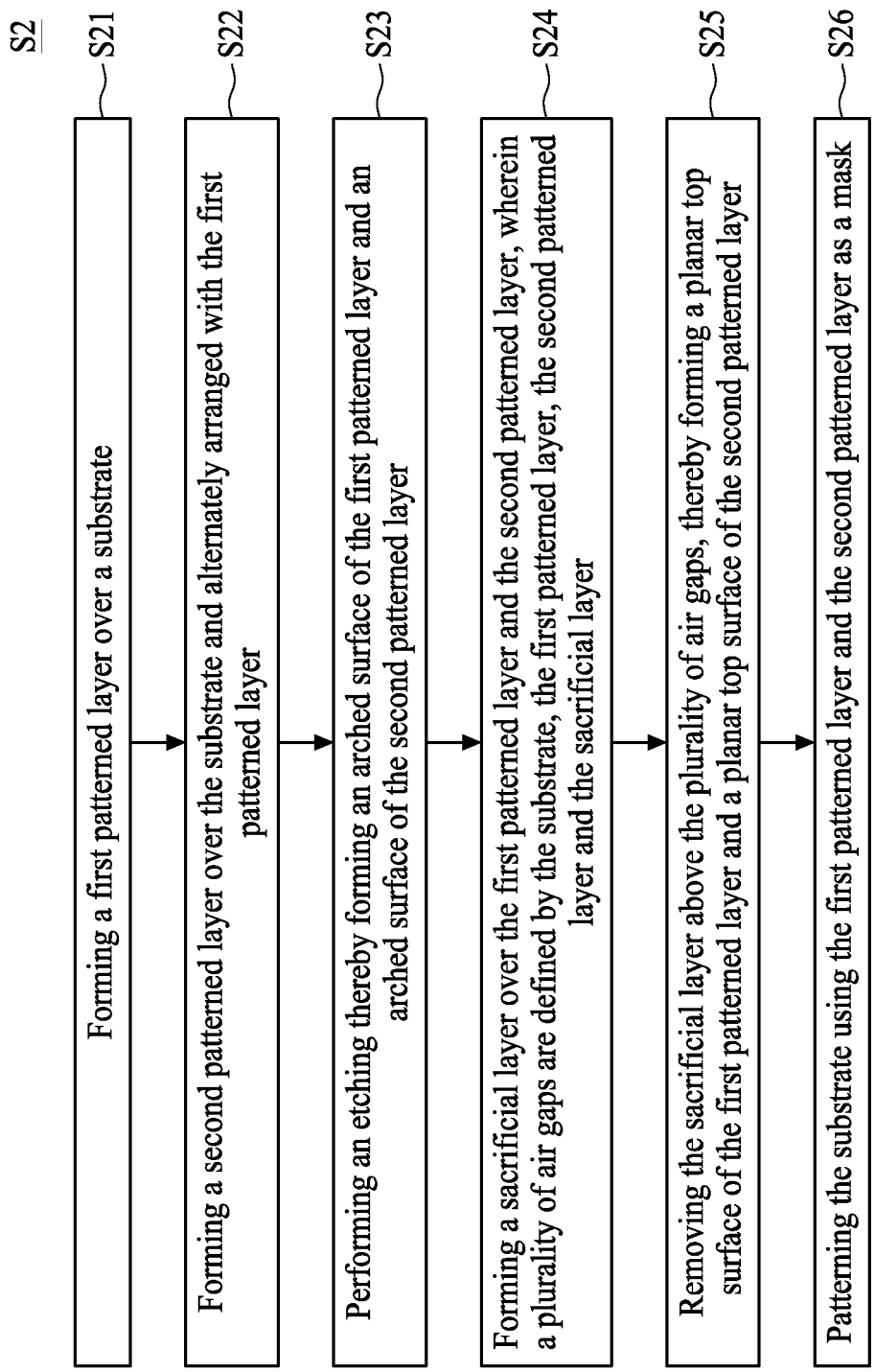
FIG. 2 is a flow diagram illustrating a method of manufacturing a semiconductor structure in accordance with some embodiments of the present disclosure.

FIG. 2 is a flow diagram illustrating a method S2 for manufacturing a semiconductor device in accordance with some embodiments of the present disclosure. The method S2 includes a number of operations (S21, S22, S23, S24, S25 and S26) and the description and illustration are not deemed as a limitation to the sequence of the operations. In the operation S21, a first patterned layer is formed over a substrate. In the operation S22, a second patterned layer is formed over the substrate. The second patterned layer and the first patterned layer are alternately arranged. In the operation S23, an etching is performed, thereby forming an arched surface of the first patterned layer and an arched surface of the second patterned layer. In the operation S24, a sacrificial layer is formed over the first patterned layer and the second patterned layer, wherein a plurality of air gaps are defined by the substrate, the first patterned layer, the second patterned layer and the sacrificial layer. In the operation S25, the sacrificial layer above the plurality of air gaps is removed, and a planar top surface of the first patterned layer and a planar top surface of the second patterned layer are thereby formed. In the operation S26, the substrate is patterned using the first patterned layer and the second patterned layer as a mask.

Figure 3:
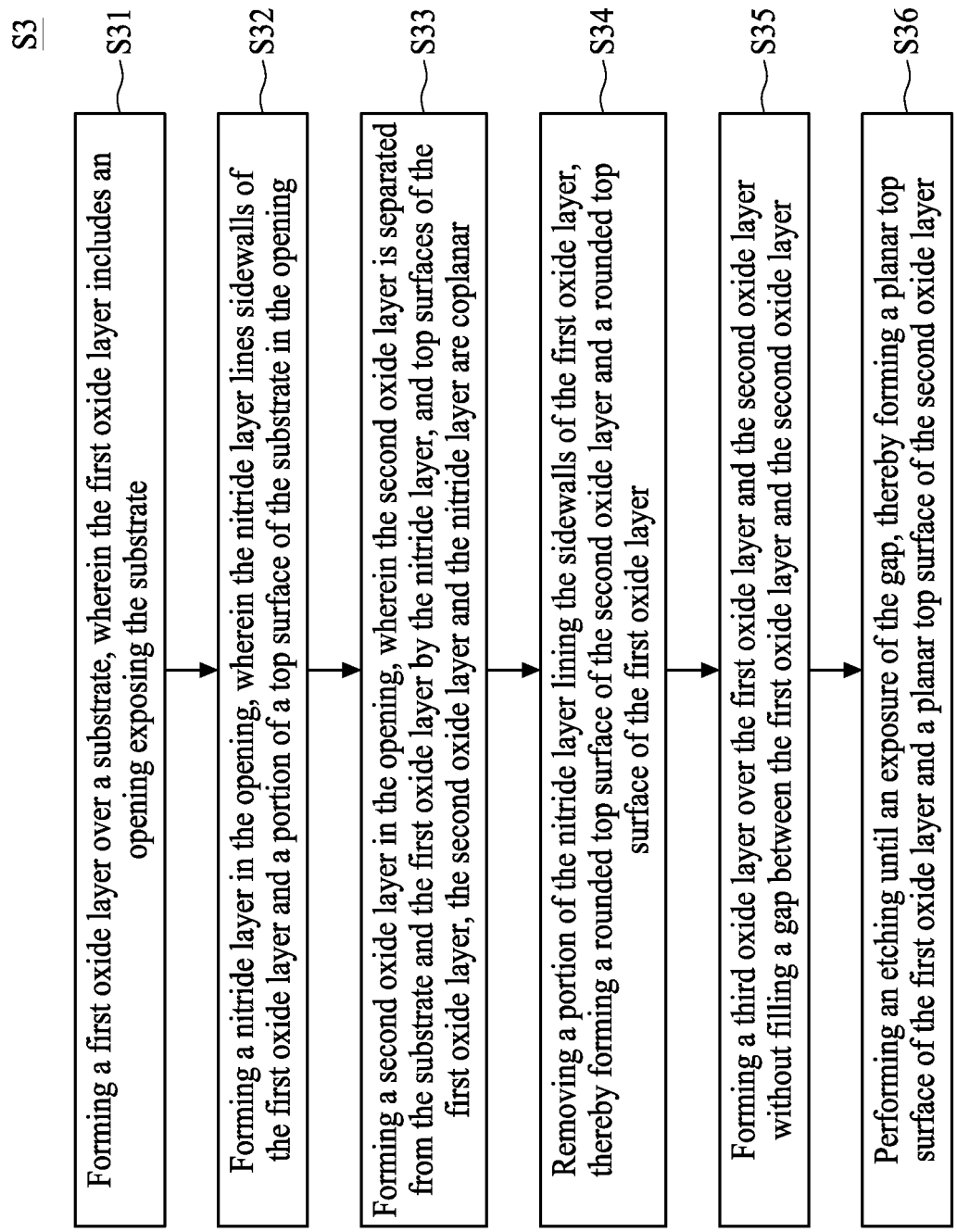
FIG. 3 is a flow diagram illustrating a method of manufacturing a semiconductor structure in accordance with some embodiments of the present disclosure.

FIG. 3 is a flow diagram illustrating a method S3 for manufacturing a semiconductor device in accordance with some embodiments of the present disclosure. The method S3 includes a number of operations (S31, S32, S33, S34, S35 and S36) and the description and illustration are not deemed as a limitation to the sequence of the operations. In the operation S31, a first oxide layer is formed over a substrate, wherein the first oxide layer includes an opening exposing the substrate. In the operation S32, a nitride layer is formed, wherein the nitride layer lines sidewalls of the first oxide layer and a portion of a top surface of the substrate in the opening. In the operation S33, a second oxide layer is formed in the opening. The second oxide layer is separated from the substrate and the first oxide layer by the nitride layer, and top surfaces of the first oxide layer, the second oxide layer and the nitride layer are coplanar. In the operation S34, a portion of the nitride layer lining the sidewalls of the first oxide layer is removed, and a rounded top surface of the second oxide layer and a rounded top surface of the first oxide layer are thereby formed. In the operation S35, a third oxide layer is formed over the first oxide layer and the second oxide layer without filling a gap between the first oxide layer and the second oxide layer. In the operation S36, an etching is performed until the gap is exposed, thereby forming a planar top surface of the first oxide layer and a planar top surface of the second oxide layer.

The method S1, the method S2 and the method S3 are within a same concept of the present disclosure, and in order to further illustrate details of the method S1, the method S2, the method S3, and the concept of the present disclosure, the method S1, the method S2 and the method S3 are comprehensively described with embodiments of the present disclosure.

FIGS. 4 to 16 are schematic diagrams illustrating various fabrication stages constructed according to the method S1, S2 or S3 for manufacturing a semiconductor structure 10 in accordance with some embodiments of the present disclosure. The stages shown in FIGS. 4 to 16 are also illustrated schematically in the process flow in FIG. 1, 2 or 3. In the subsequent discussion, the fabrication stages shown in FIGS. 4 to 16 are discussed in reference to the process steps in FIG. 1, 2 or 3.

Figure 4:
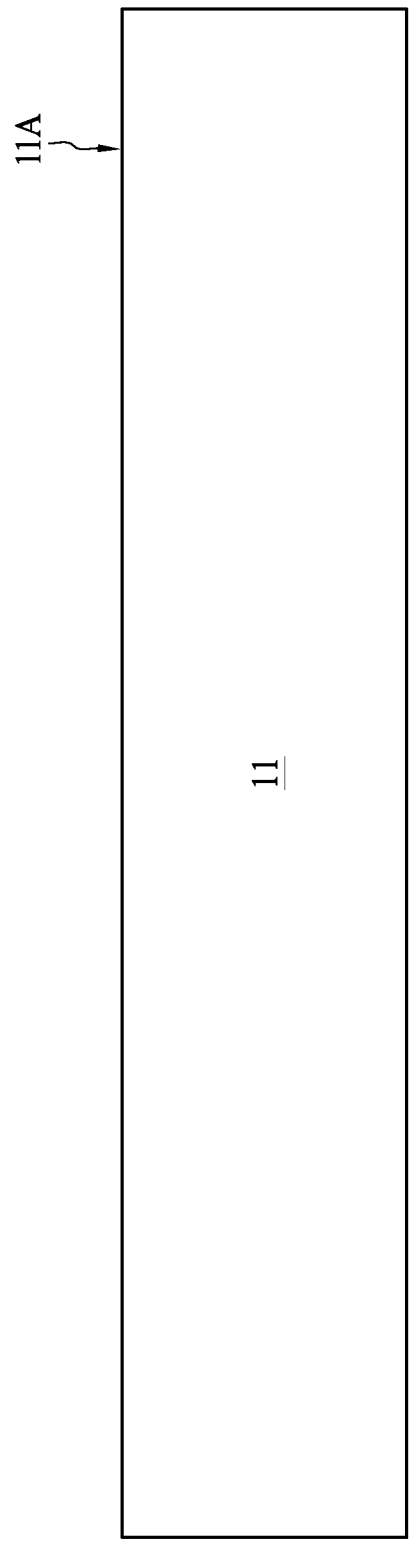
FIGS. 4 to 13 are cross-sectional diagrams of intermediate stages in the formation of a semiconductor structure in accordance with some embodiments of the present disclosure.

Referring to FIG. 4, FIG. 4 is a schematic cross-sectional diagram at a stage of the method S1, the method S2 and/or the method S3 in accordance with some embodiments of the present disclosure. Prior to the operation S11, the operation S21 and/or the operation S31, a substrate 11 is provided, received, or formed.

The substrate 11 may be a semiconductor substrate, such as a bulk semiconductor, a semiconductor-on-insulator (SOI) substrate, or the like. The substrate 11 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. For a purpose of simplicity, the substrate 11 depicted in FIG. 4 can be a topmost layer of a multilayer structure of the substrate 11. In some embodiments, the topmost layer of the substrate 11 includes crystalline silicon.

Figure 5:
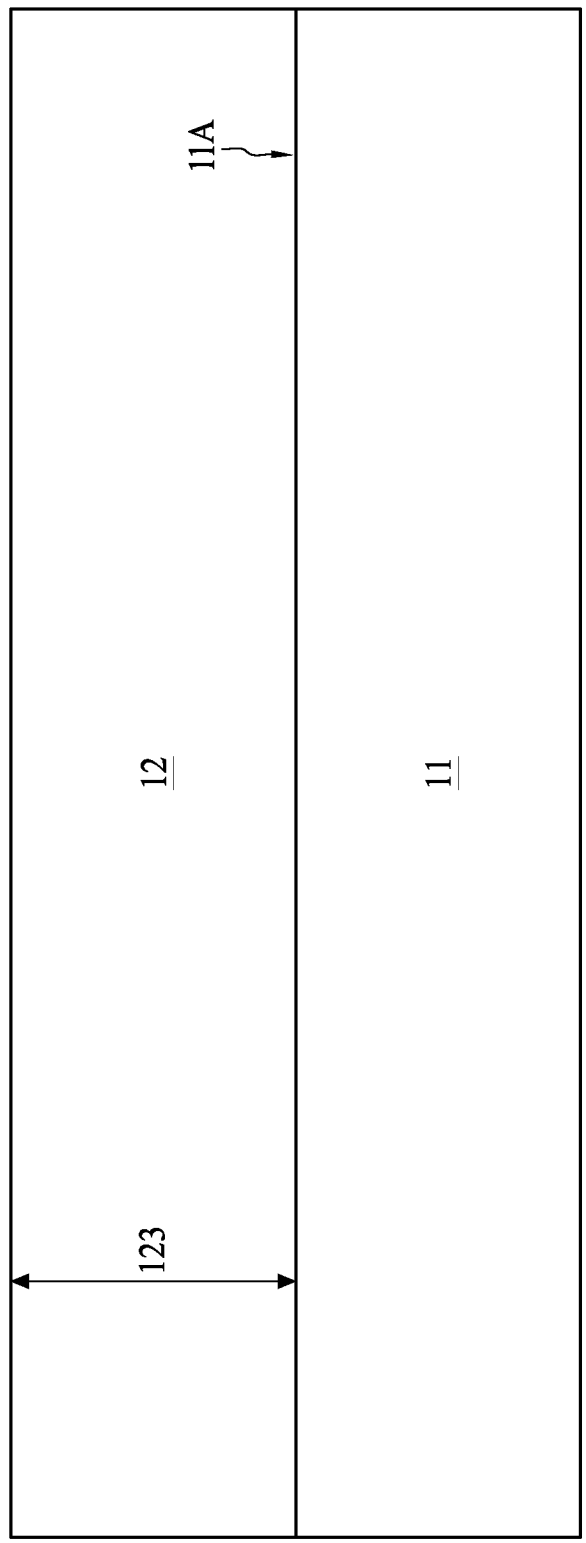

Referring to FIG. 5, FIG. 5 is a schematic cross-sectional diagram at a stage of the method S1, the method S2 and/or the method S3 in accordance with some embodiments of the present disclosure. After the substrate 11 is provided, a first layer 12 is formed over the substrate 11. In some embodiments, the first layer 12 is formed over a top surface 11A of the substrate 11. In some embodiments, a thickness 123 of the first layer 12 is in a range of 50 to 300 nanometers (nm). In some embodiments, the first layer 12 includes one or more dielectric materials. In some embodiments, the dielectric material includes silicon oxide ($SiO_x$), silicon nitride ($Si_xN_y$), silicon oxynitride (SiON), or a combination thereof. In some embodiments, the first layer 12 includes silicon dioxide ($SiO_2$).

In some embodiments, the dielectric material includes a polymeric material, an organic material, an inorganic material, a photoresist material or a combination thereof. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the first layer 12 is a metal-containing layer. In some embodiments, the first layer 12 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable conductive materials, oxides of the above-mentioned metals, or a combination thereof.

In some embodiments, the first layer 12 is formed by a blanket deposition. In some embodiments, the first layer 12 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

Figure 6:
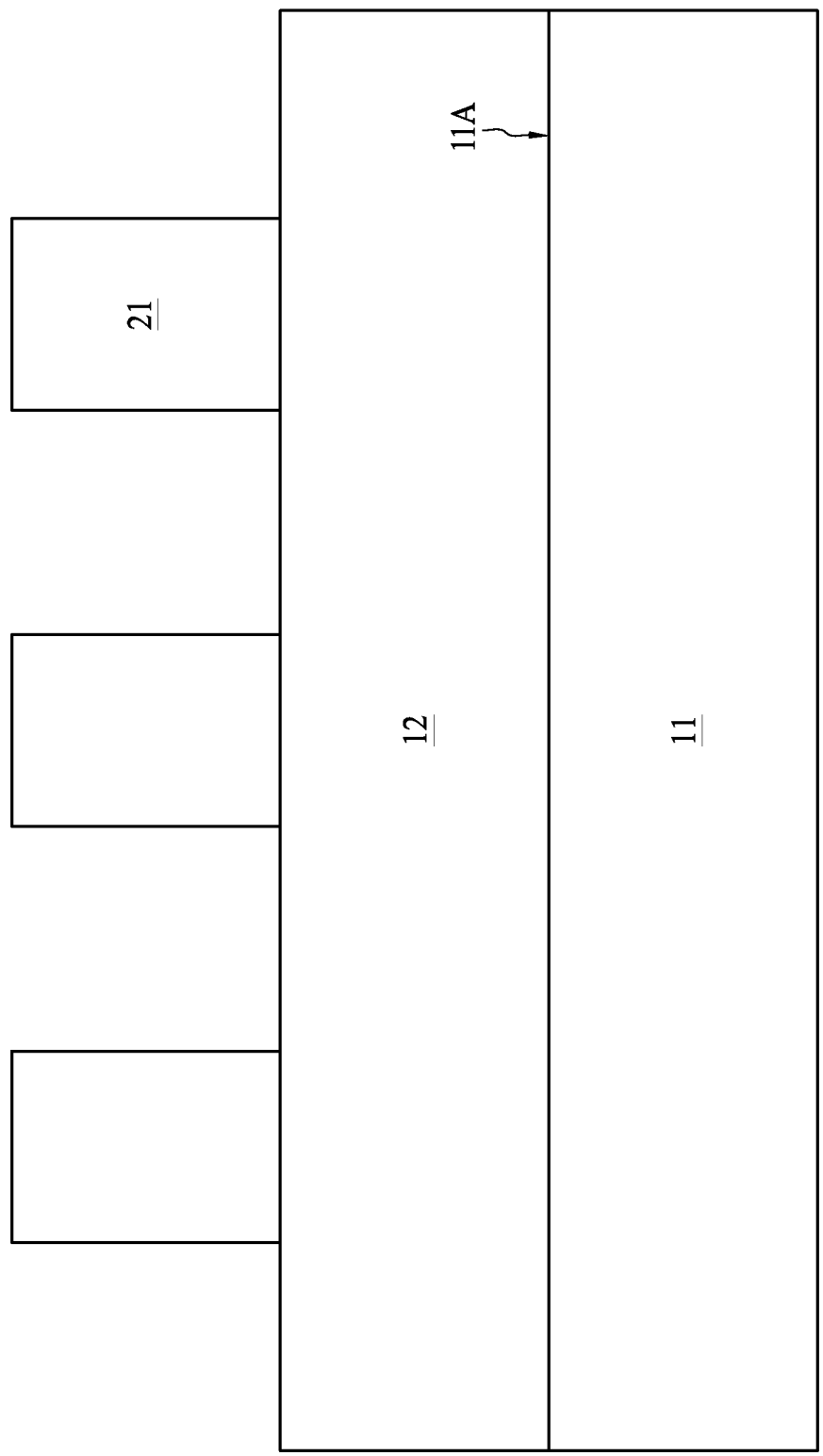
Figure 7:
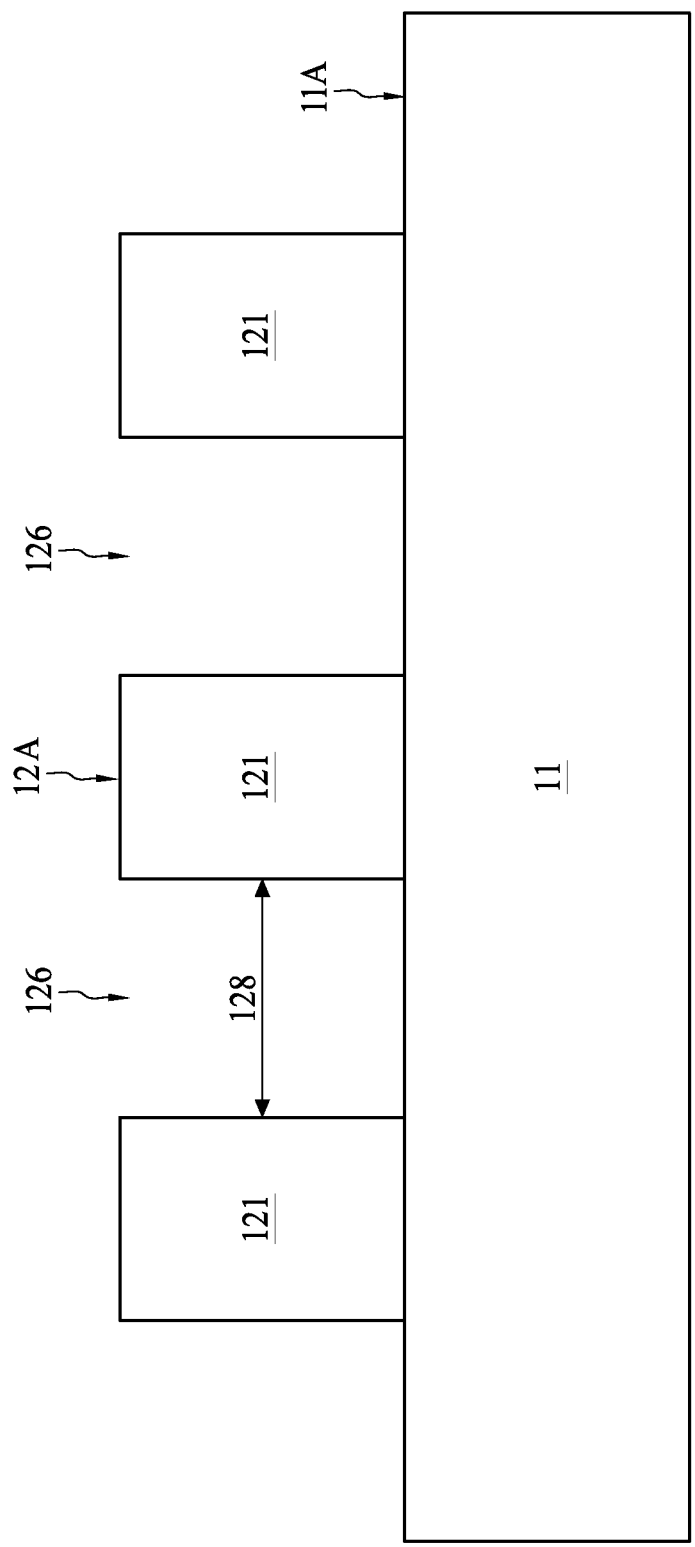

Referring to FIGS. 6 to 7, FIGS. 6 and 7 are schematic cross-sectional diagrams at different stages of the method S1, the method S2 and/or the method S3 in accordance with some embodiments of the present disclosure. In the operation S11, the operation S21 and/or the operation S31, the first layer 12 is patterned to expose portions of the substrate 11. The first layer 12 is patterned to form a first patterned layer 121, wherein the first patterned layer 121 includes a plurality of first portions as shown in FIG. 7, and at least one opening 126 is defined between adjacent first portions of the first patterned layer 121.

In some embodiments, the patterning of the first layer 12 includes lift-off, ion beam etching, directional dry etching, reactive ion etching, solution wet etching, or a combination thereof. In some embodiments, the first patterned layer 121 is defined by a photoresist layer 21 shown in FIG. 6. In some embodiments, after the formation of the first layer 12, pre-cleaning, photoresist application (formation of the photoresist layer 21), exposure, developing and etching are sequentially performed to form the first patterned layer 121.

Figure 8:
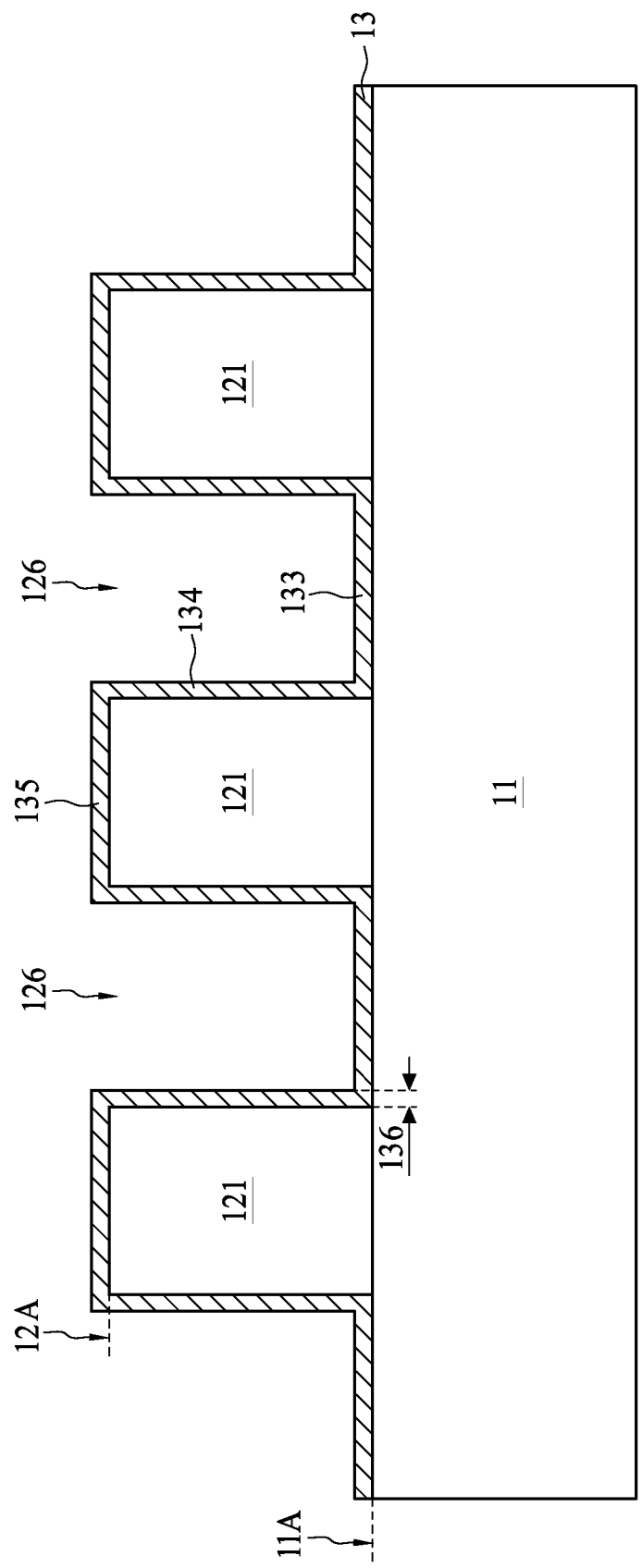

Referring to FIG. 8, FIG. 8 is a schematic cross-sectional diagram at a stage of the method S1, the method S2 and/or the method S3 in accordance with some embodiments of the present disclosure. In the operation S12, prior to the operation S22 and/or in the operation S32, a conformal layer 13 is formed over the first patterned layer 121 and the substrate 11. In some embodiments, a profile of the conformal layer 13 is conformal to a profile of the first patterned layer 121 and the substrate 11. In some embodiments, the conformal layer 13 includes horizontal portions 133 lining the top surface 11A of the substrate 11, horizontal portions 135 lining a top surface 12A of the first patterned layer 121, and vertical portions 134 connecting the horizontal portions 133 and the horizontal portions 135. In some embodiments, the conformal layer 13 lines the openings 126. In some embodiments, the conformal layer 13 lines sidewalls of portions of the first patterned layer 121 and a portion of the top surface 11A of the substrate 11 in the openings 126. In some embodiments, the conformal layer 13 is in contact with the top surface 12A of the first patterned layer 121, a sidewall of the first patterned layer 121, and a top surface of the substrate 11.

In some embodiments, the conformal layer 13 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the conformal layer 13 includes one or more dielectric materials. The dielectric material of the conformal layer 13 may be selected from the dielectric materials described in reference to the first layer 12, and repeated description is omitted herein. In some embodiments, the dielectric material of the conformal layer 13 is different from that of the first patterned layer 121 for a purpose of etching to be performed later in the process. In some embodiments, the first patterned layer 121 includes oxide, and the conformal layer 13 includes nitride. In some embodiments, a thickness 136 of the conformal layer 13 is in a range of 5 to 30 nm. In some embodiments, the thickness 136 is substantially consistent throughout the entire conformal layer 13.

Figure 9:
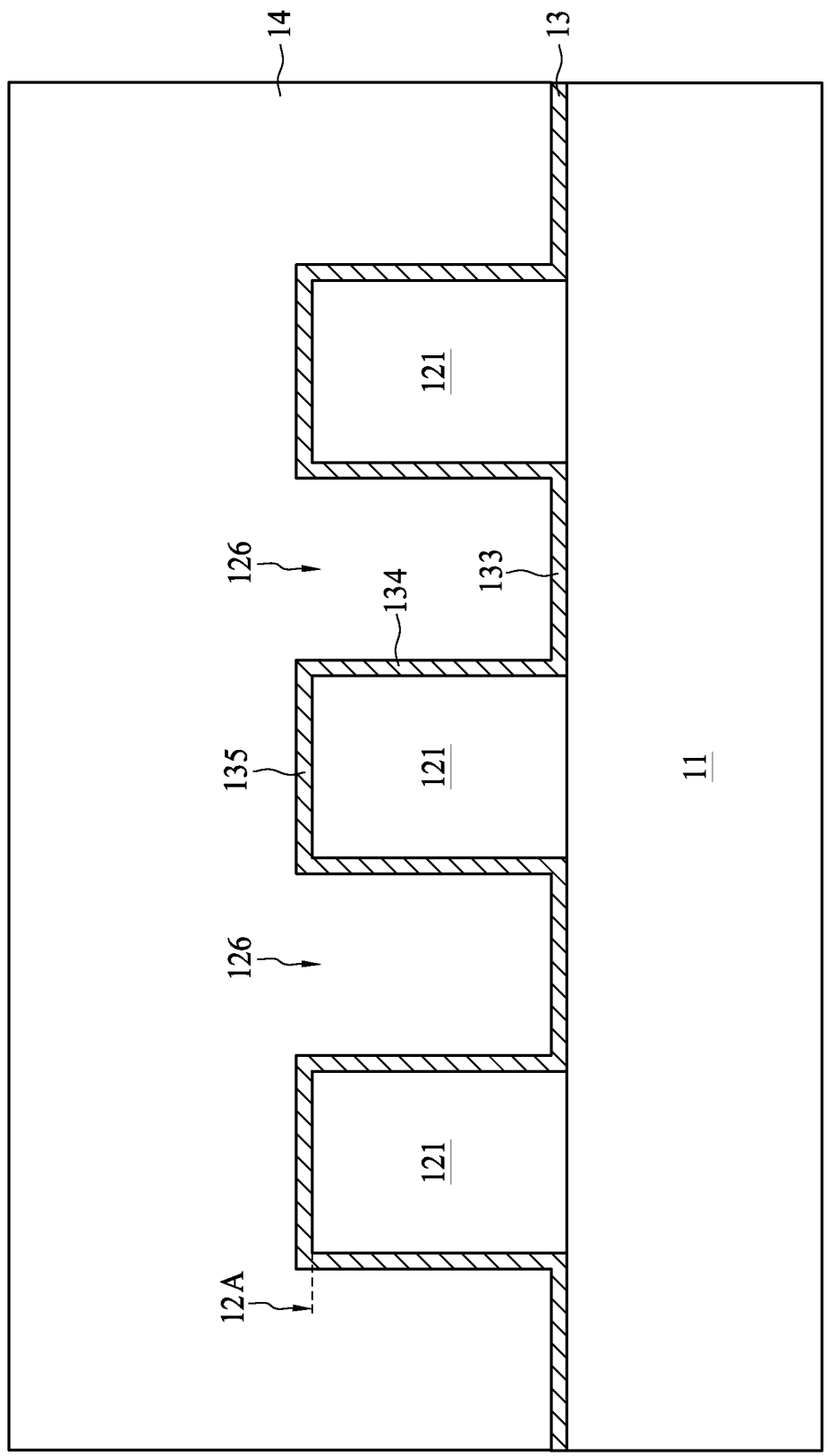

Referring to FIG. 9, FIG. 9 is a schematic cross-sectional diagram at a stage of the method S1, the method S2 and/or the method S3 in accordance with some embodiments of the present disclosure. In the operation S13, prior to the operation S22 and/or prior to the operation S33, a second layer 14 is formed over the conformal layer 13. In some embodiments, the formation of the second layer 14 includes a blanket deposition. In some embodiments, the formation of the second layer 14 includes a chemical vapor deposition (CVD), a physical vapor deposition (PVD), or a combination thereof.

In some embodiments, the second layer 14 includes one or more dielectric materials. The dielectric material of the second layer 14 may be selected from the dielectric materials described in reference to the first layer 12, and repeated description is omitted herein. In some embodiments, the dielectric material of the second layer 14 is the same as that of the first patterned layer 121 for a purpose of etching to be performed later in the process. In some embodiments, the second layer 14 includes oxide. In some embodiments, the second layer 14 at least fills the openings 126. In some embodiments, the second layer 14 is disposed over the first patterned layer 121 and between portions of the first patterned layer 121. In some embodiments, a thickness of the second layer 14 is greater than 50 nm. In some embodiments, the thickness of the second layer 14 is greater than 90 nm. In some embodiments, the thickness of the second layer 14 is in a range of 60 to 700 nm. In some embodiments, the thickness of the second layer 14 is substantially greater than the thickness 123 of the first layer 12.

Figure 10:
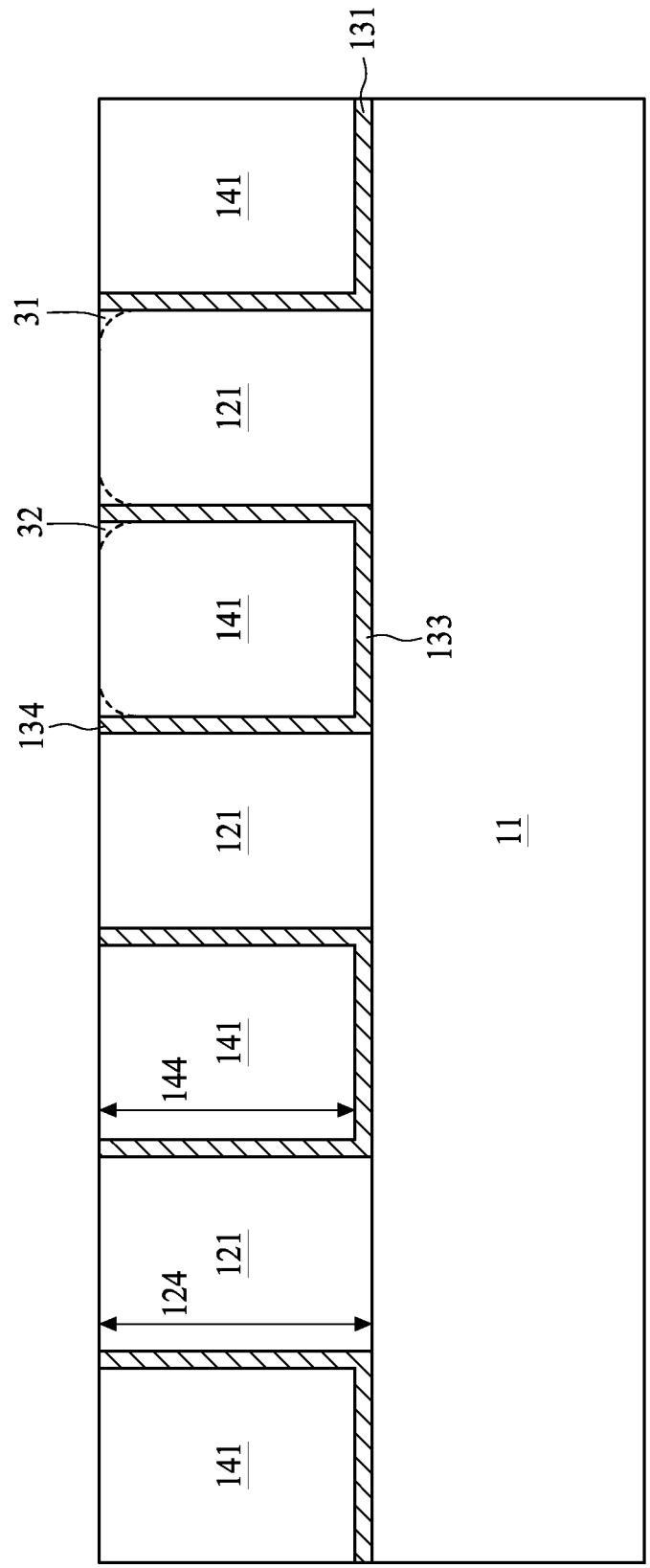

Referring to FIG. 10, FIG. 10 is a schematic cross-sectional diagram at a stage of the method S1, the method S2 and/or the method S3 in accordance with some embodiments of the present disclosure. In the operation S14, the operation S22 and/or the operation S33, a first etching is performed until the first patterned layer 121 is exposed. In some embodiments, the first etching includes ion beam etching, directional dry etching, reactive ion etching, solution wet etching, or a combination thereof. In some embodiments, the first etching includes a directional dry etching. In some embodiments, a detection of a material of the conformal layer 13 at an etched surface is performed after a certain length of time period of the first etching. A result of the detection can indicate the exposure of the first patterned layer 121.

In some embodiments, a portion of the second layer 14 disposed above the first patterned layer 121 is removed by the first etching. In some embodiments, horizontal portions 135 of the conformal layer 13 shown in FIG. 9 covering tops of portions of the first patterned layer 121 are removed by the first etching. In some embodiments, a surficial portion of the first patterned layer 121 is also removed by the first etching. As a result, a second patterned layer 141 and a conformal layer 131 are formed. The second patterned layer 141 is alternately arranged with the first patterned layer 121. In some embodiments, the second patterned layer 141 includes portions of the second layer 14 surrounded by the conformal layer 13 or 131. In some embodiments, the conformal layer 131 includes the vertical portions 134 and the horizontal portions 133. In some embodiments, the conformal layer 131 lines each of the openings 126. In some embodiments, the conformal layer 131 covers only inner surfaces of the openings 126. In some embodiments, the second patterned layer 141 is separated from the substrate 11 and the first patterned layer 121 by the conformal layer 131. In some embodiments, the second patterned layer 141 is separated from the substrate 11 by horizontal portions 133 of the conformal layer 131 and from the first patterned layer 121 by vertical portions of the conformal layer 131. In some embodiments, top surfaces of the first patterned layer 121, the second patterned layer 141 and the conformal layer 131 are coplanar. In some embodiments, a thickness 124 of the first patterned layer 121 is substantially less than the thickness 123 of the first layer 12 as shown in FIG. 5. In some embodiments, the thickness 124 is substantially greater than a thickness 144 of the second patterned layer 141. In some embodiments, a total thickness of the second patterned layer 141 and the conformal layer 131 is substantially equal to the thickness 124 of the first patterned layer 121.

Figure 11:
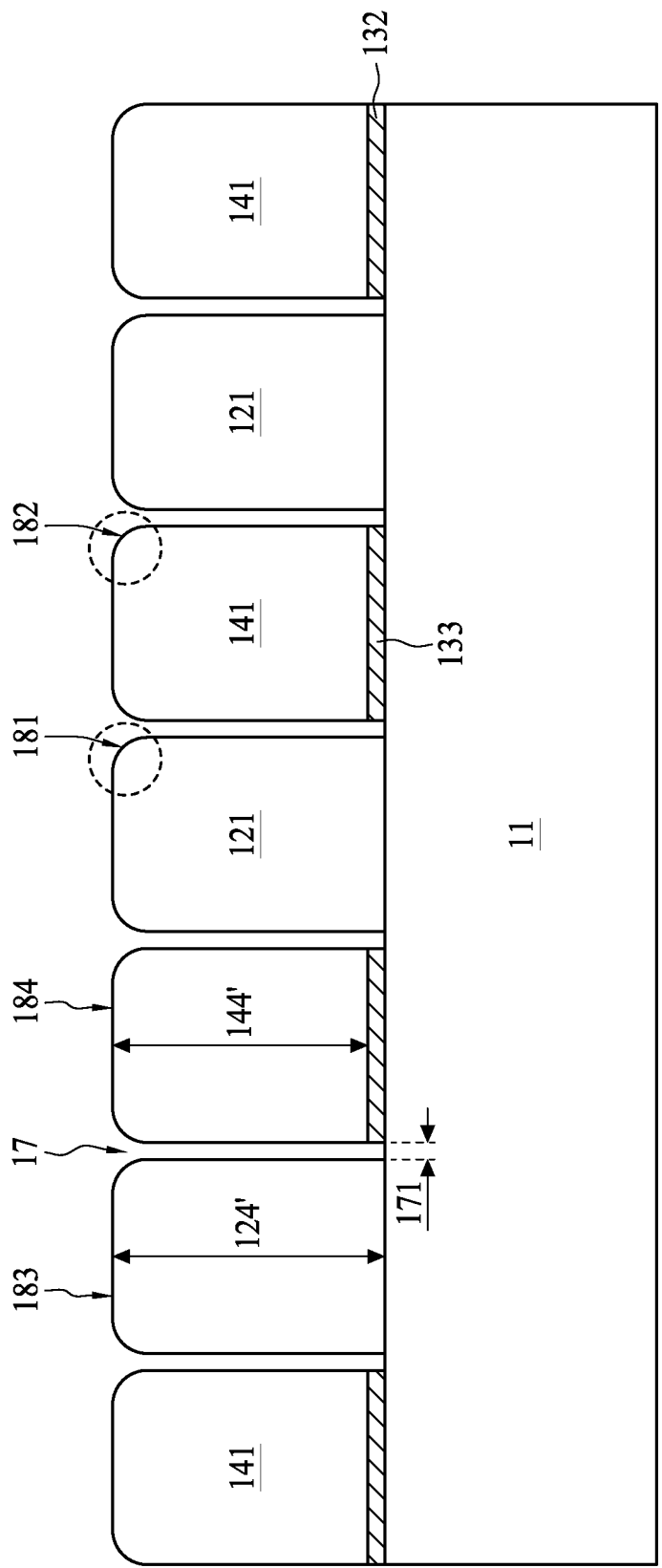

Referring to FIG. 11, FIG. 11 is a schematic cross-sectional diagram at a stage of the method S1, the method S2 and/or the method S3 in accordance with some embodiments of the present disclosure. In the operation S15, the operation S23 and/or the operation S34, the vertical portions 134 of the conformal layer 131 are removed. In some embodiments, the vertical portions 134 of the conformal layer 131 are disposed between the first patterned layer 121 and the second patterned layer 141. In some embodiments, the vertical portions 134 of the conformal layer 131 line the sidewalls of each of the portions of the first patterned layer 121. In some embodiments, a second etching is performed to remove the vertical portions 134 of the conformal layer 131. As a result, a plurality of gaps 17 are formed between the first patterned layer 121 and the second patterned layer 141. In some embodiments, the gaps 17 are at the vertical portions 134 of the conformal layer 131 previously removed. In some embodiments, portions of the substrate 11 are exposed in the gaps 17. In some embodiments, a width 171 of the gaps 17 is defined by the thickness 136 of the conformal layer 13 shown in FIG. 8. In some embodiments, the width 171 of the gaps 17 is substantially equal to the thickness 136 of the conformal layer 13. In some embodiments, horizontal portions 133 of the conformal layer 131 disposed between the substrate 11 and the second patterned layer 141 remain in place and collectively become a segmental layer 132.

In some embodiments, corner portions 31 of the first patterned layer 121 and corner portions 32 the second patterned layer 141 shown in FIG. 10 (as indicated in dotted lines) are removed concurrently with the removal of the vertical portions 134 of the conformal layer 131 to form rounded corners (as circled in a dotted line in FIG. 11). In some embodiments, the corner portions 31 of the first patterned layer 121 and the corner portions 32 the second patterned layer 141 are removed by the second etching. In some embodiments, an arched surface 181 of the first patterned layer 121 and an arched surface 182 of the second patterned layer 141 are formed by the second etching.

As a result, the first patterned layer 121 includes a rounded top surface 183 and the second patterned layer 141 includes a rounded top surface 184 after the second etching. In some embodiments, a thickness 124' of the first patterned layer 121 at this stage is substantially equal to the thickness 124 of the first patterned layer 121 shown in FIG. 10, wherein the thickness 124' is measured from a highest point of the rounded surface 183 to the top surface 11A of the substrate 11. In some embodiments, a thickness 144' of the second patterned layer 141 at this stage is substantially equal to the thickness 144 of the second patterned layer 141 shown in FIG. 10, wherein the thickness 144' is measured from a highest point of the rounded surface 184 to a top surface of the segmental layer 132.

Figure 12:
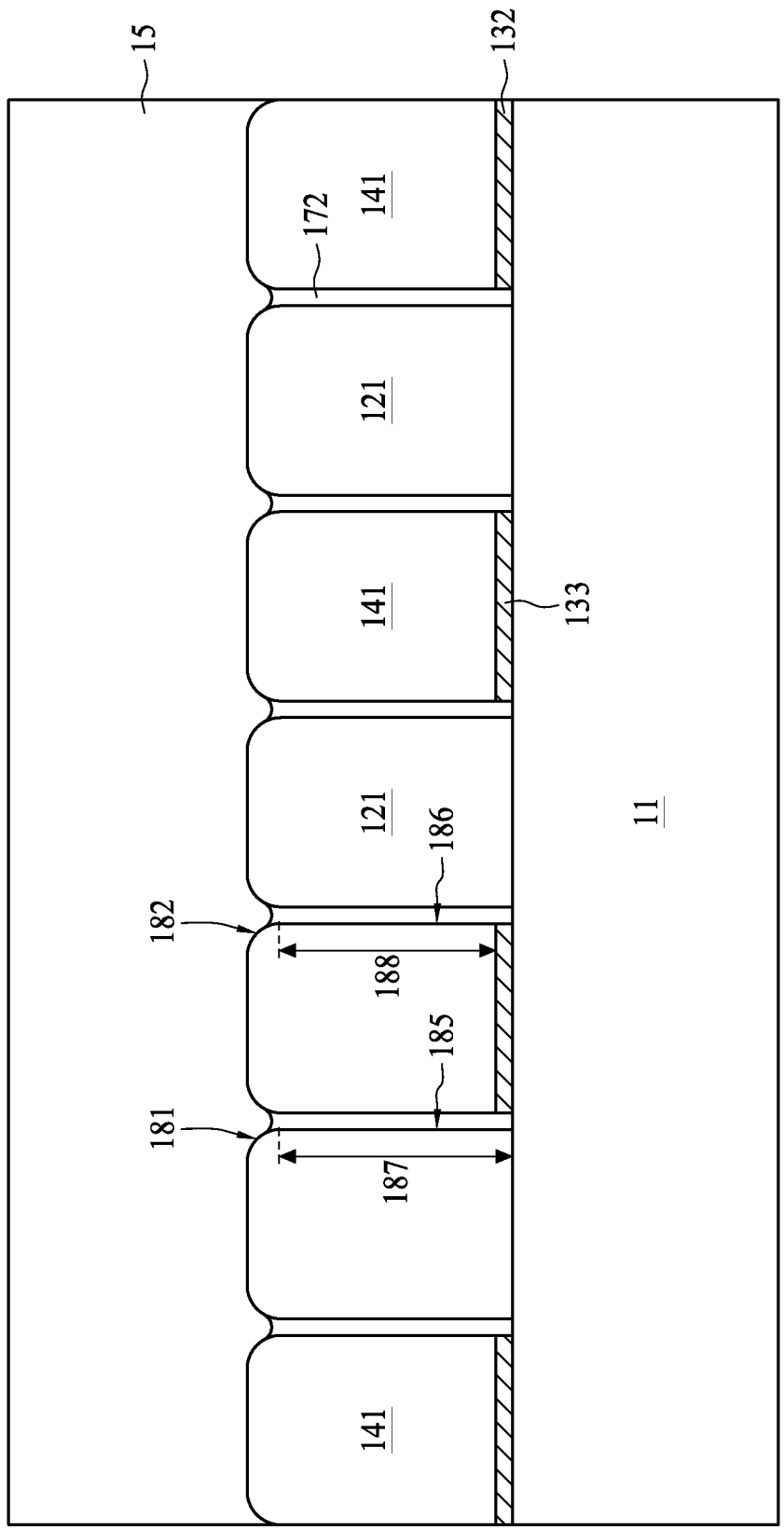

Referring to FIG. 12, FIG. 12 is a schematic cross-sectional diagram at a stage of the method S1, the method S2 and/or the method S3 in accordance with some embodiments of the present disclosure. In the operation S16, the operation S24 and/or the operation S35, a sacrificial layer 15 is formed over the first patterned layer 141 and the second patterned layer 142 without filling the gaps 17 between the first patterned layer 141 and the second patterned layer 142. In some embodiments, the gaps 17 are sealed by the sacrificial layer 15 to form a plurality of air gaps 172. In some embodiments, the air gaps 172 are defined by the first patterned layer 141, the second patterned layer 142, the substrate 11 and the sacrificial layer 15. In some embodiments, the sacrificial layer 15 includes a dielectric material same as that of the first patterned layer 121 and/or that of the second patterned layer 141. In some embodiments, the sacrificial layer 15 includes oxide.

In some embodiments, the sacrificial layer 15 is formed by a chemical vapor deposition (CVD), a physical vapor deposition (PVD), or a combination thereof. A deposition rate of the sacrificial layer 15 is controlled so that the sacrificial layer 15 does not fill the gaps 17. In some embodiments, the deposition rate of the sacrificial layer 15 is greater than that of the first layer 12, that of the second layer 14, and/or that of the conformal layer 13. In some embodiments, the sacrificial layer 15 is in contact with the arched surfaces 181 and 182 of the first patterned layer 121 and the second patterned layer 141. In some embodiments, the sacrificial layer 15 is in contact with an entirety of the arched surfaces 181 and 182 of the first patterned layer 121 and the second patterned layer 141. In some embodiments, the sacrificial layer 15 is separated from a planar surface 185 of the first patterned layer 121, wherein the planar surface 185 is connected to the arched surface 181. In some embodiments, the planar surface 185 has a height 187 measured from a connecting point of the planar surface 185 and the arched surface 181 to the substrate 11. In some embodiments, the sacrificial layer 15 is separated from a planar surface 186 of the second patterned layer 141, wherein the planar surface 186 is connected to the arched surface 182. In some embodiments, the planar surface 186 has a height 188 measured from a connecting point of the planar surface 186 and the arched surface 182 to the segmental layer 132.

Figure 13:
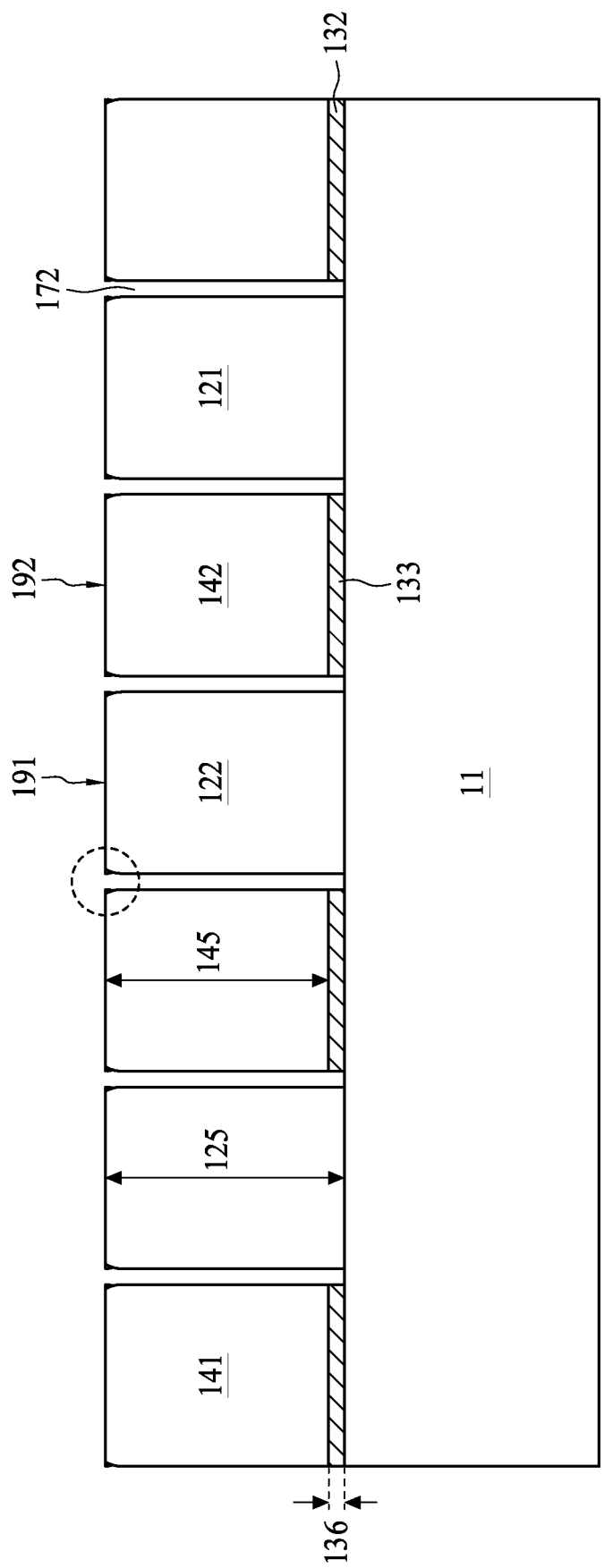

Referring to FIG. 13, FIG. 13 is a schematic cross-sectional diagram at a stage of the method S1, the method S2 and/or the method S3 in accordance with some embodiments of the present disclosure. In the operation S17, the operation S25 and/or the operation S36, a third etching is performed until the air gaps 172 are exposed. In some embodiments, the third etching includes ion beam etching, directional dry etching, reactive ion etching, solution wet etching, or a combination thereof.

In some embodiments, upper portions of the first patterned layer 121 and upper portions of the second patterned layer 141 above the air gaps 172 are also removed by the third etching. For a purpose of illustration, the first patterned layer 121 after the third etching is labelled as 122, and the second patterned layer 141 after the third etching is labelled as 142. In some embodiments, the first patterned layer 122 includes a planar top surface 191, and the second patterned layer 142 includes a planar top surface 192. In some embodiments, the planar top surface 191 and the planar top surface 192 are coplanar.

Figure 14:
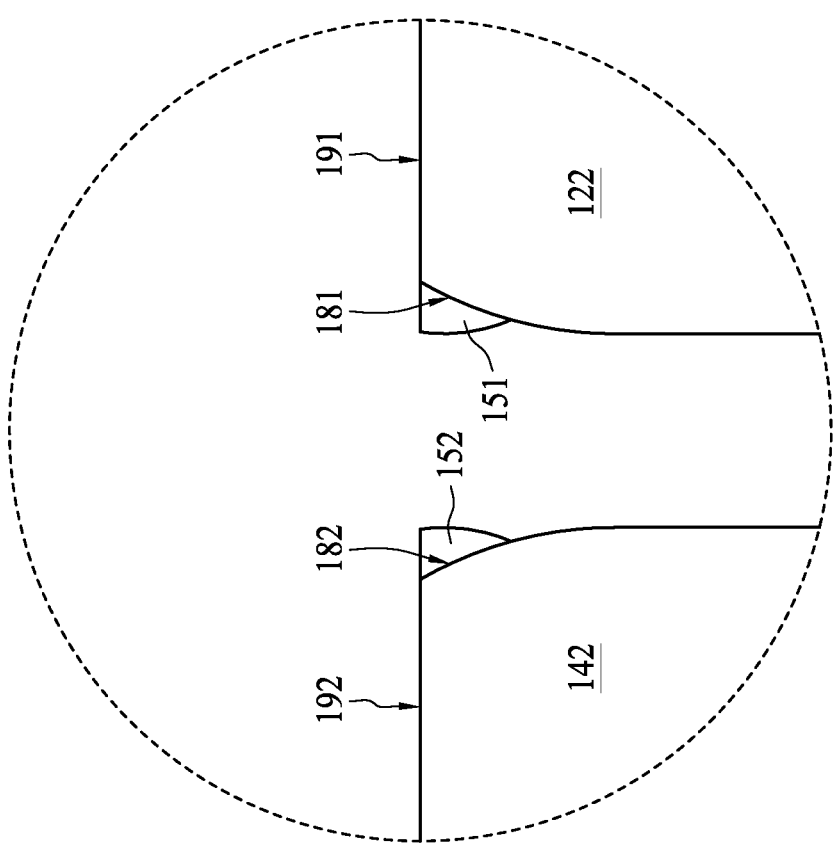
FIG. 14 is an enlarged schematic diagram of a dotted region shown in FIG. 13 in accordance with some embodiments of the present disclosure.

In some embodiments, portions 151 of the sacrificial layer 15 are left on the first patterned layer 122, and portions of 152 of the sacrificial layer 15 are left on the second patterned layer 142. Referring to FIG. 14, FIG. 14 is an enlarged schematic diagram of a portion of the intermediate structure in a dotted circle indicated in FIG. 13. In some embodiments, the portions 151 are attached to at least a part of the arched surface 181 of the first patterned layer 122. In some embodiments, the portions 152 are attached to at least a part of the arched surface 182 of the second patterned layer 142.

In some embodiments, a material of the sacrificial layer 15 is same as that of the first patterned layer 122, and a boundary between the portion 151 and the first patterned layer 122 may not be present or may be invisible. In some embodiments, a top surface of the portion 151 is considered as a portion of the planar top surface 191. Similarly, in some embodiments, the material of the sacrificial layer 15 is same as that of the second patterned layer 142, and a top surface of the portion 152 is considered as a portion of the planar top surface 192. Therefore, the sacrificial layer 15 serves a purpose of replacing at least some of the corner portions 31 and 32 of the first patterned layer 121 and the second patterned layer 141 removed by the second etching.

Referring back to FIG. 13, as a result, the first patterned layer 122 and the portions 151 are combined to form the planar top surface 191 and provide a substantially rectangular profile. The second patterned layer 142 and the portions 152 combine to form the planar top surface 192 and provide a substantially rectangular profile. In some embodiments, a thickness 125 of the first patterned layer 122 is substantially less than the thickness 124' or the thickness 124 of the first patterned layer 121. In some embodiments, the thickness 125 is substantially greater than the height 187 of the planar surface 185. In some embodiments, a thickness 145 of the second patterned layer 142 is substantially less than the thickness 144' or the thickness 144 of the second patterned layer 141. In some embodiments, the thickness 145 is substantially greater than the height 188 of the planar surface 186.

Figure 15:
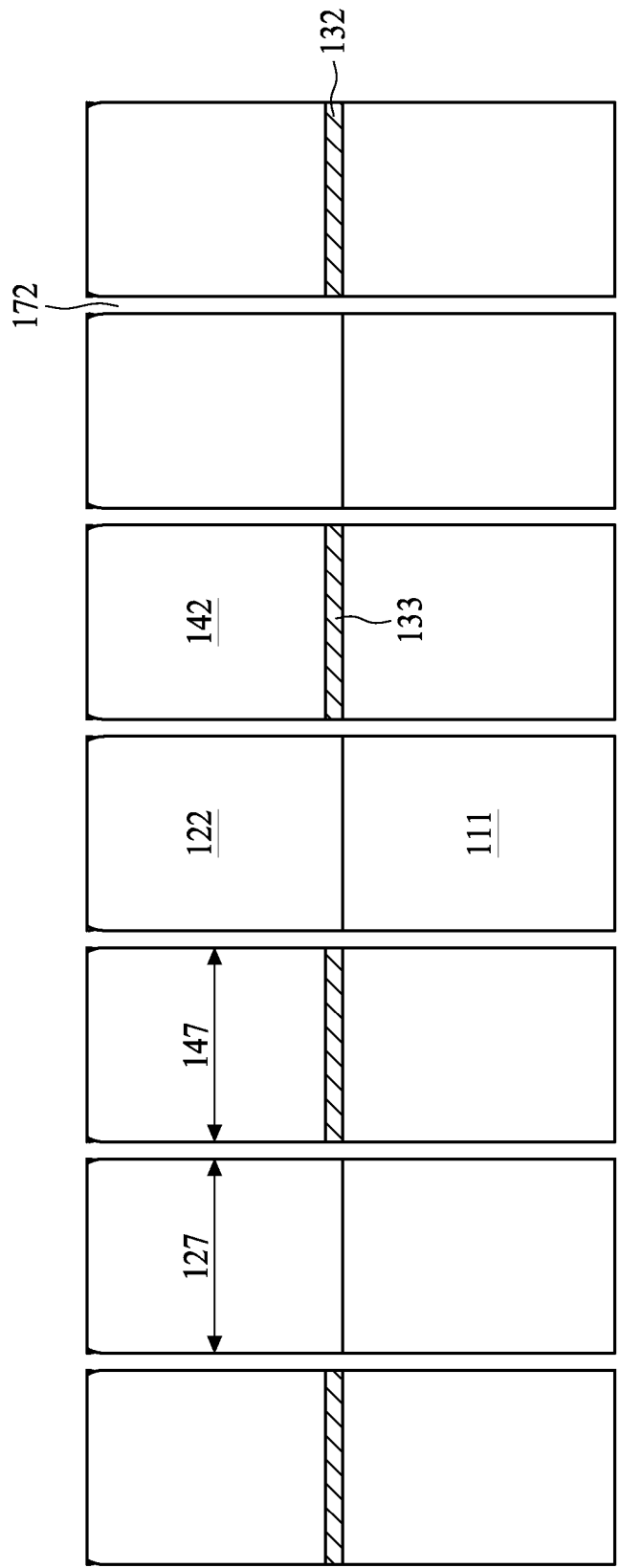
FIGS. 15 to 16 are cross-sectional diagrams of intermediate stages in the formation of a semiconductor structure in accordance with some embodiments of the present disclosure.

Referring to FIG. 15, FIG. 15 is a schematic cross-sectional diagram at a stage of the method S1, the method S2 and/or the method S3 in accordance with some embodiments of the present disclosure. After the operation S17, in the operation S26 and/or after the operation S36, a patterning is performed on the substrate 11 using the first patterned layer 122 and the second patterned layer 142 as a mask. In some embodiments, the patterning includes an ion beam etching, a directional dry etching, a reactive ion etching, a solution wet etching, or a combination thereof. As described above, the substrate 11 depicted in FIG. 15 may represent only the topmost layer of the substrate 11. In some embodiments, a portion of the topmost layer of the substrate 11 exposed in the gap 172 is removed. In some embodiments, a pattern of the first patterned layer 122 and the second patterned layer 142 is transferred to the topmost layer of the substrate 11, thereby forming a patterned substrate 111. In some embodiments, a material of the topmost layer of the substrate 11 is different from that of the first patterned layer 122 and/or that of the second patterned layer 142. In some embodiments, the material of the topmost layer of the substrate 11 is different from that of the portions 151 and 152 and/or that of the segmental layer 132.

Figure 16:
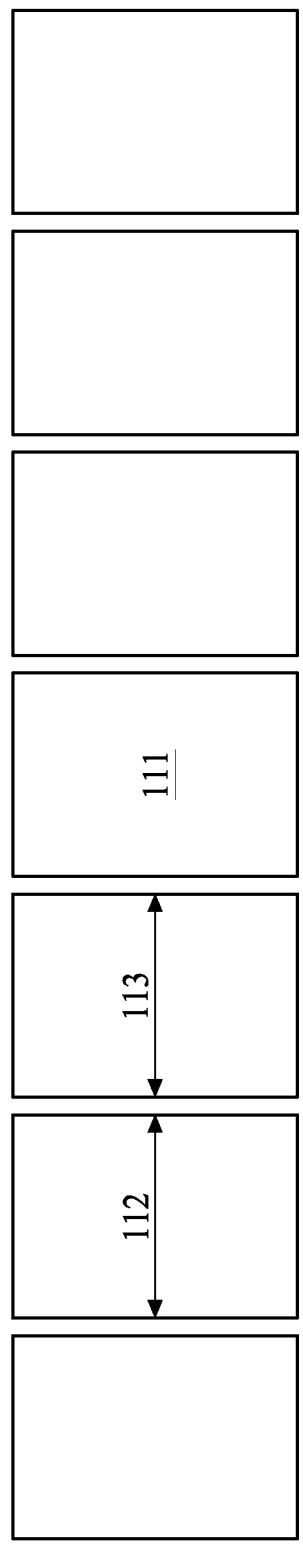

Referring to FIG. 16, FIG. 16 is a schematic cross-sectional diagram at a stage of the method S1, the method S2 and/or the method S3 in accordance with some embodiments of the present disclosure. After the operation S17, the operation S26 and/or the operation S36, the first patterned layer 122, the second patterned layer 142 and the segmental layer 132 are removed, and the semiconductor structure 10 is thereby formed. In some embodiments, one or more etchings are performed to remove the first patterned layer 122, the second patterned layer 142 and the segmental layer 132 individually or concurrently. In some embodiments, the one or more etchings include an ion beam etching, a dry etching, a reactive ion etching, a solution wet etching, or a combination thereof. In some embodiments, the removal of the first patterned layer 122, the second patterned layer 142 and the segmental layer 132 includes a lift-off operation. In some embodiments, a post-cleaning operation is performed on the semiconductor structure 10 shown in FIG. 16 after the removal of the first patterned layer 122, the second patterned layer 142 and the segmental layer 132.

It should be noted that a width 127 of a portion of the first patterned layer 122 and a width 147 of a portion of the second patterned layer 142 can be controlled and adjusted according to different applications. In some embodiments, the width 127 and the width 147 are substantially equal, as shown in FIG. 15. In some embodiments, widths of different portions (e.g., 112 and 113 shown in FIG. 16 indicate widths of two random portions of the patterned substrate 111) are substantially equal. In alternative embodiments, a width of the first patterned layer 122 is different from a width of the second patterned layer 142.

FIGS. 17 to 25 are schematic diagrams illustrating various fabrication stages constructed according to the method S1, S2 or S3 for manufacturing a semiconductor structure 20 in accordance with alternative embodiments of the present disclosure. The stages shown in FIGS. 17 to 25 are also illustrated schematically in the process flow in FIG. 1, 2 or 3. In the subsequent discussion, the fabrication stages shown in FIGS. 17 to 25 are discussed in reference to the process steps in FIG. 1, 2 or 3.

For ease of illustration, reference numerals with similar or same functions and properties are repeatedly used in different embodiments and figures. For a purpose of brevity, only differences from the embodiments illustrated above are emphasized in the following specification, and descriptions of similar or same elements, functions, properties and/or processing are omitted.

Figure 17:
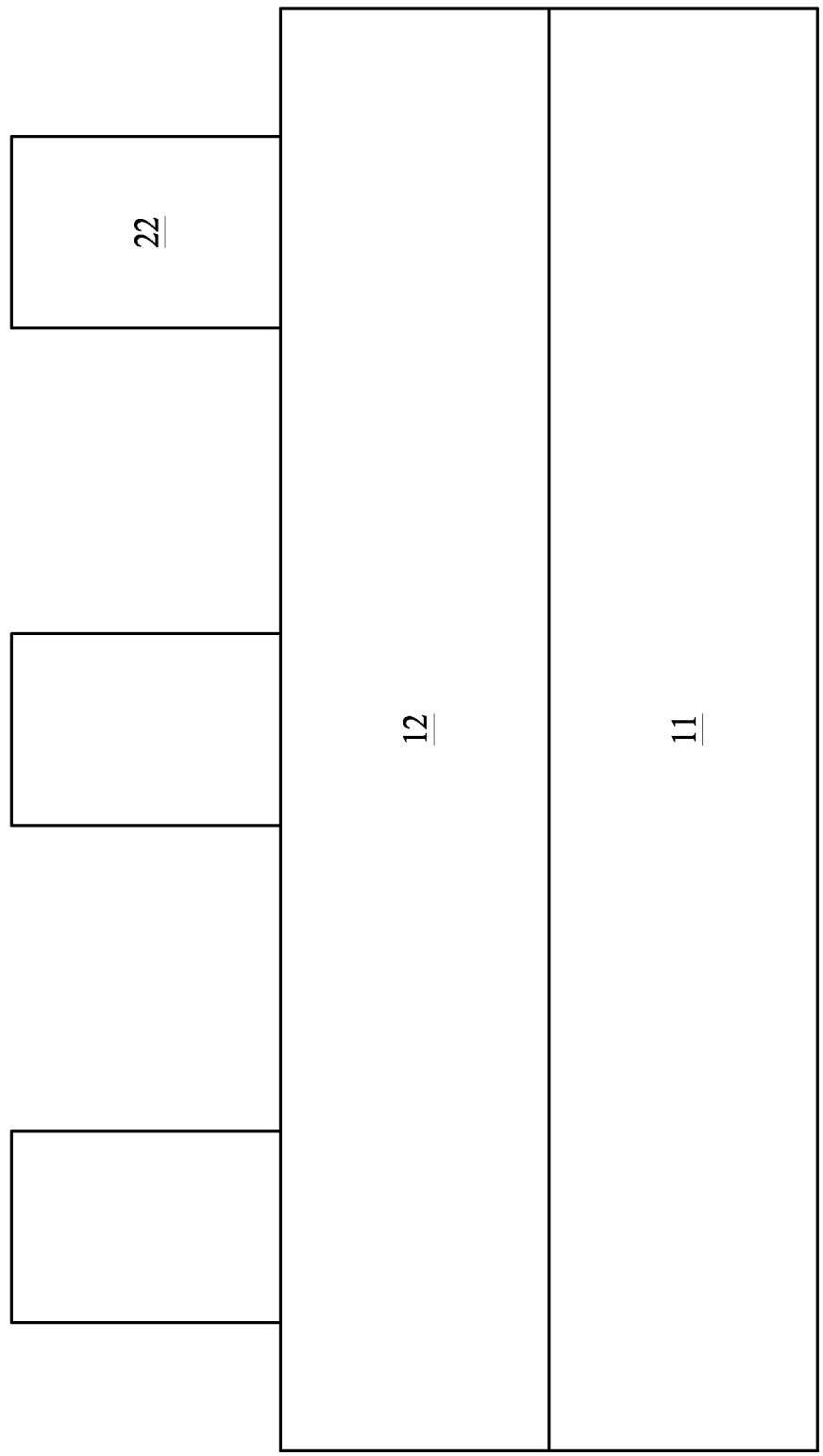
FIGS. 17 to 24 are cross-sectional diagrams of intermediate stages in the formation of a semiconductor structure in accordance with some embodiments of the present disclosure.

Referring to FIG. 17, FIG. 17 is a schematic cross-sectional diagram at a stage of the method S1, the method S2 and/or the method S3 in accordance with some embodiments of the present disclosure. After formation of the first layer 12 shown in FIG. 5, a photoresist layer 22 having a pattern different from that of the photoresist layer 21 is applied on the first layer 12.

Figure 18:
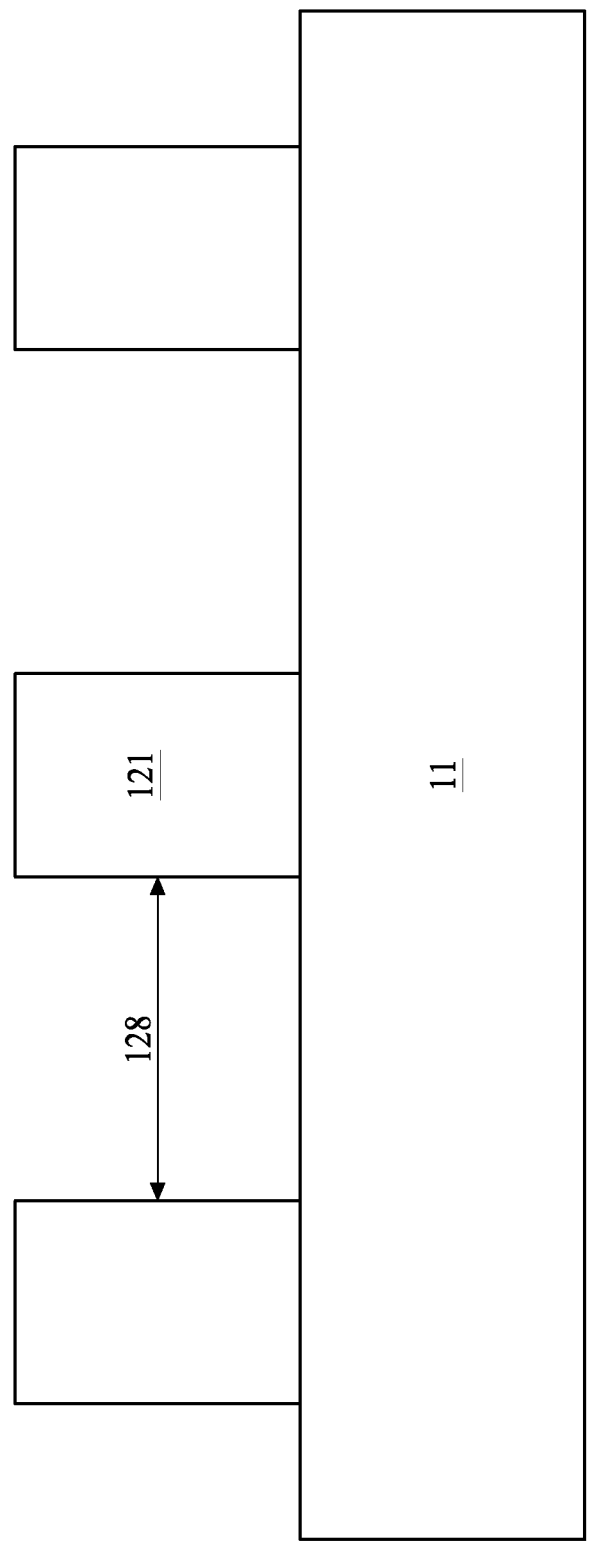

Referring to FIG. 18, FIG. 18 is a schematic cross-sectional diagram at a stage of the method S1, the method S2 and/or the method S3 in accordance with some embodiments of the present disclosure. The first patterned layer 121 is formed, and a distance 128 between adjacent portions of the first patterned layer 121 is different from that of the first patterned layer 121 shown in FIG. 7. In some embodiments, the distance 128 of the intermediate structure shown in FIG. 18 is greater than the distance 128 shown in FIG. 7.

Figure 19:
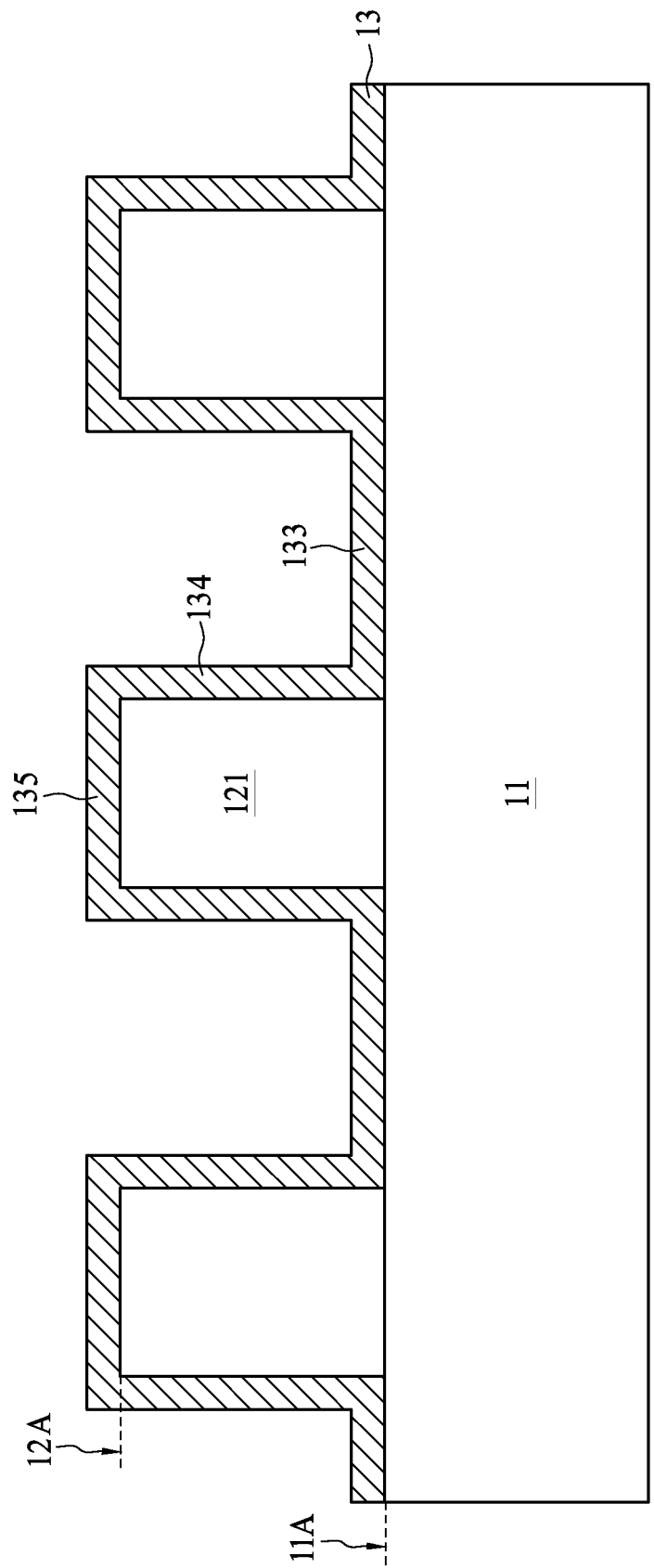

Referring to FIG. 19, FIG. 19 is a schematic cross-sectional diagram at a stage of the method S1, the method S2 and/or the method S3 in accordance with some embodiments of the present disclosure. The conformal layer 13 is formed, and a thickness 136 of the conformal layer 13 shown in FIG. 19 is greater than the thickness 136 of the conformal layer 13 shown in FIG. 8.

Figure 20:
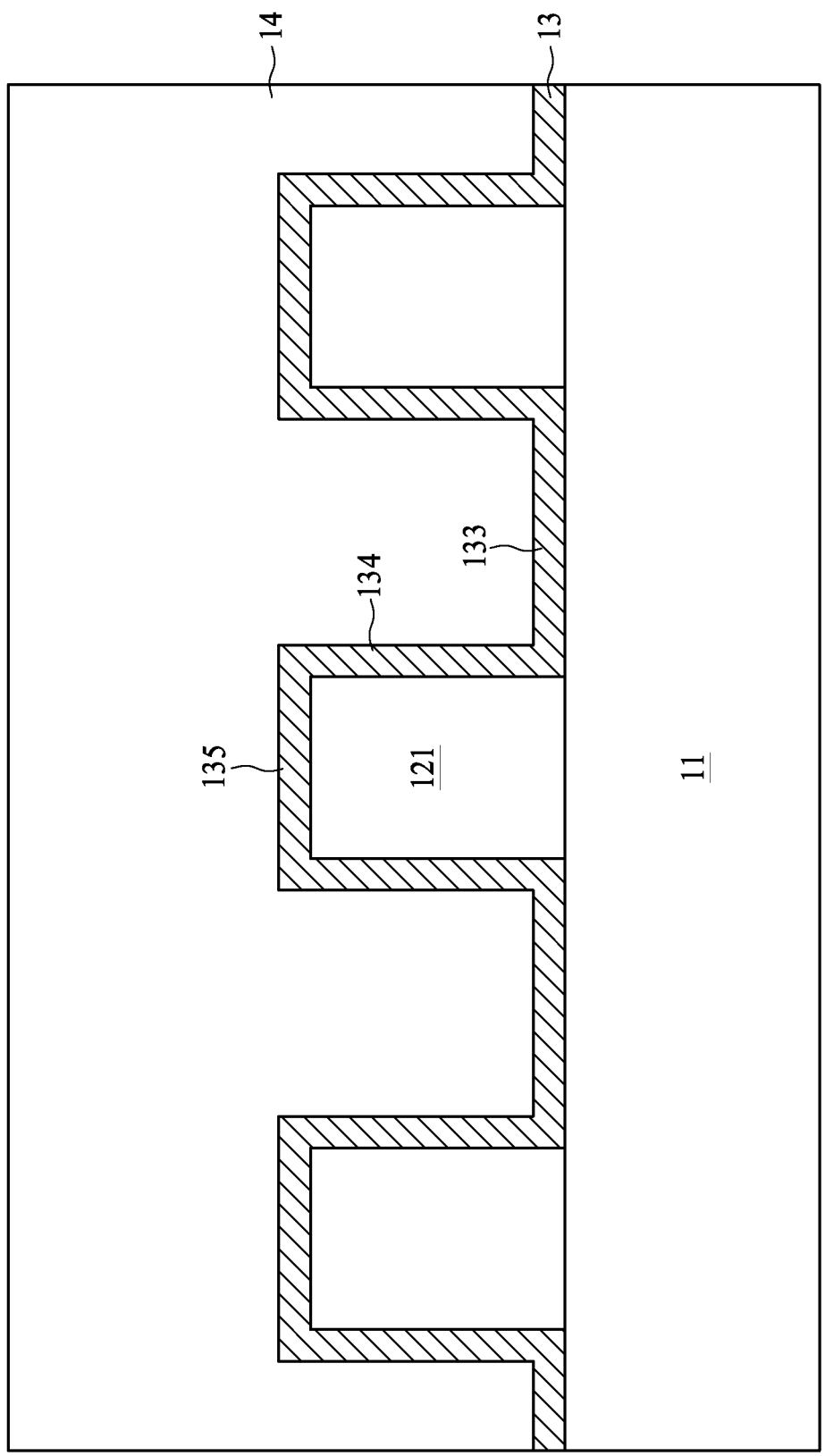
Figure 21:
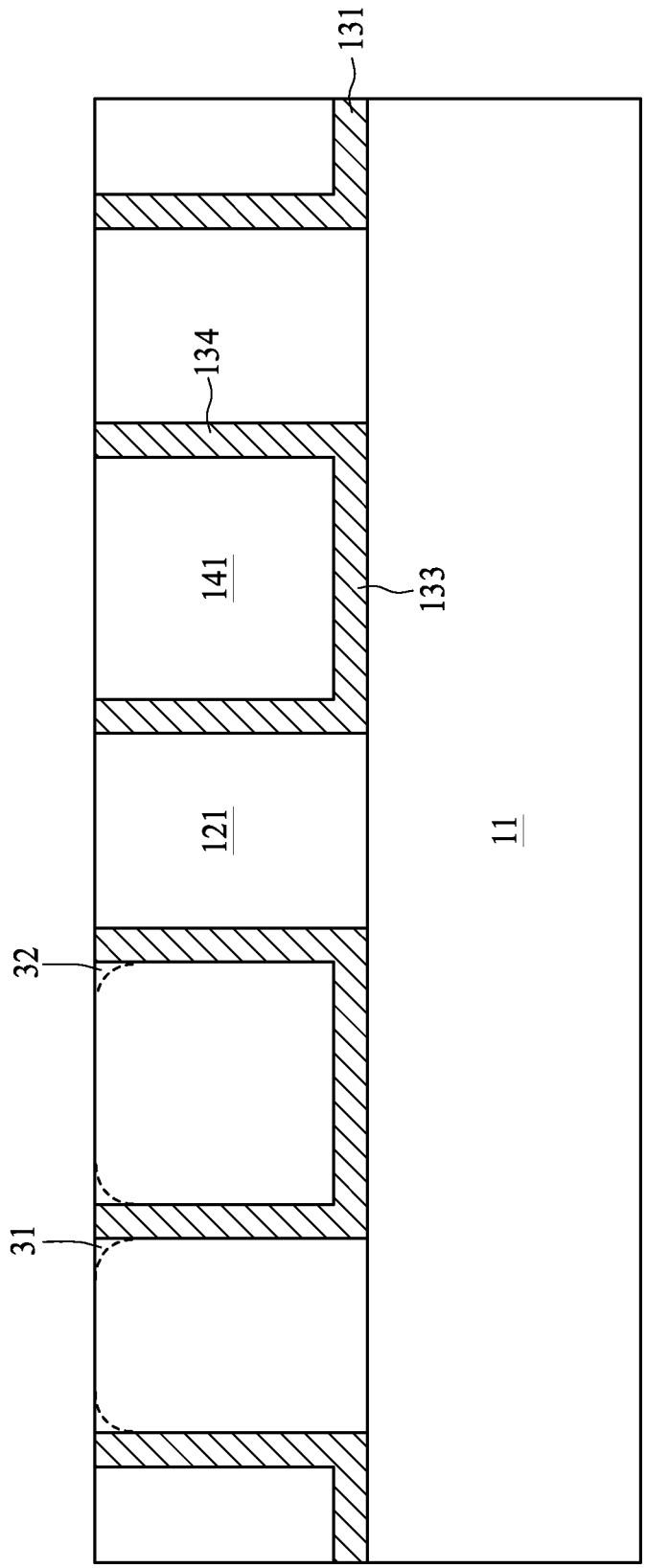
Figure 22:
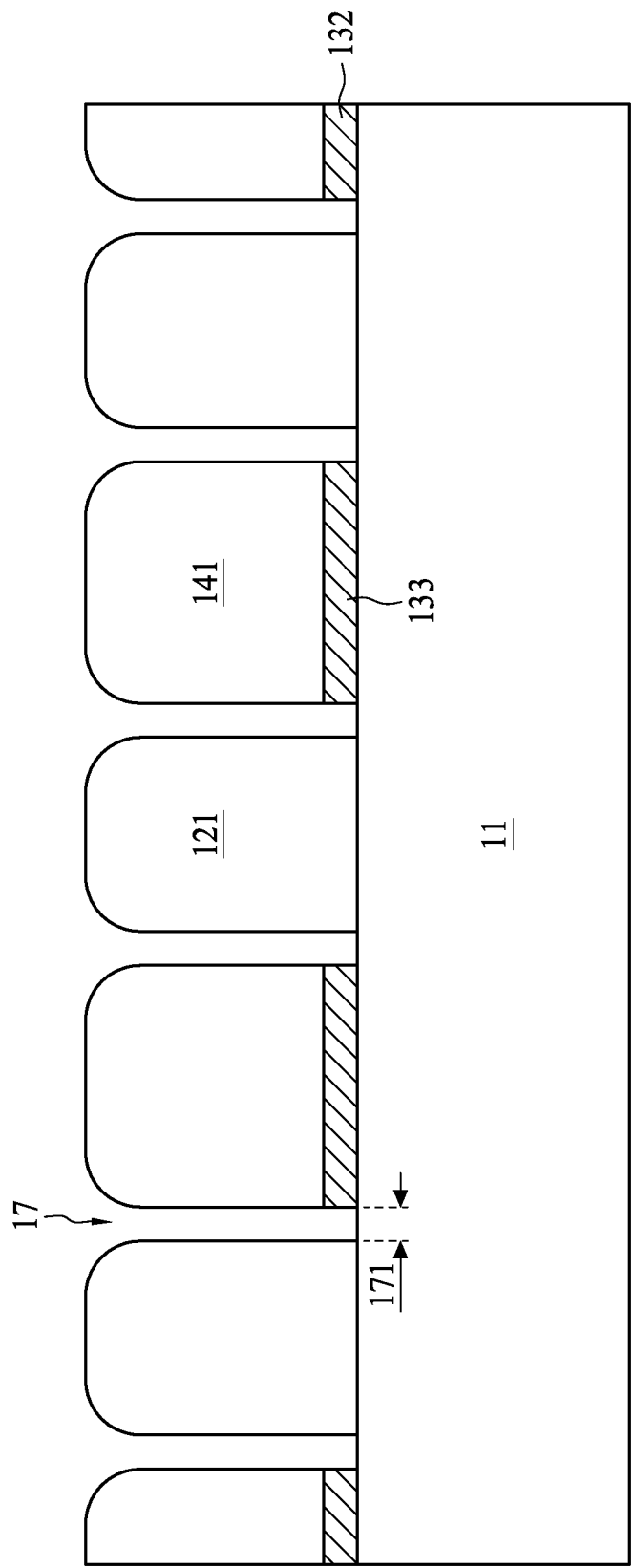

Referring to FIGS. 20 to 22, FIGS. 20 to 22 are schematic cross-sectional diagrams at different stages of the method S1, the method S2 and/or the method S3 in accordance with some embodiments of the present disclosure. Operations similar to those illustrated in FIGS. 9 to 11 are sequentially performed on the intermediate structure shown in FIG. 19. The width 171 of the air gap 17 is defined by the thickness 136 of the conformal layer 13 shown in FIG. 19, and thus the width 171 of the intermediate structure shown in FIG. 22 is greater than the width 171 of the air gap 17 shown in FIG. 11.

Figure 23:
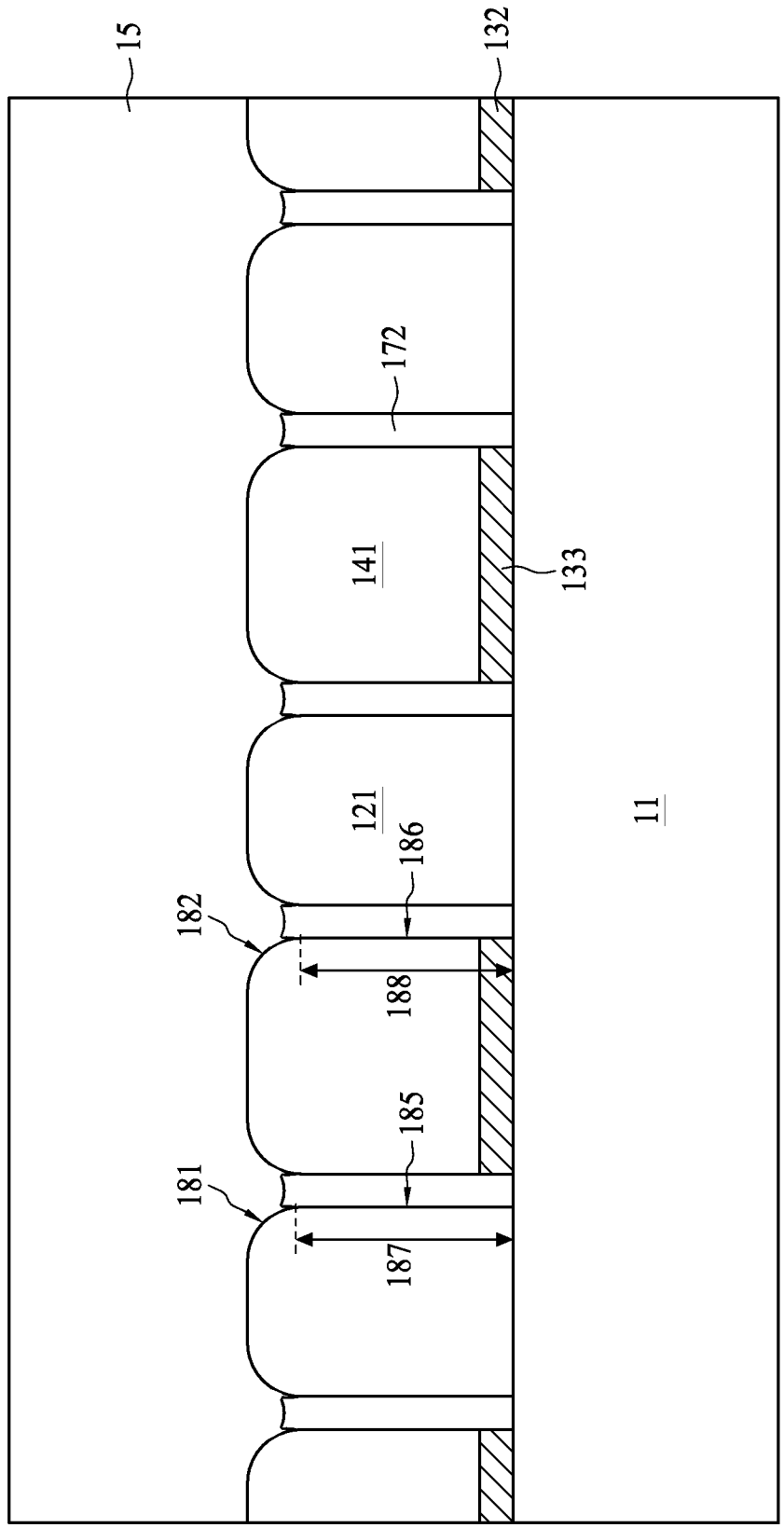
Figure 24:
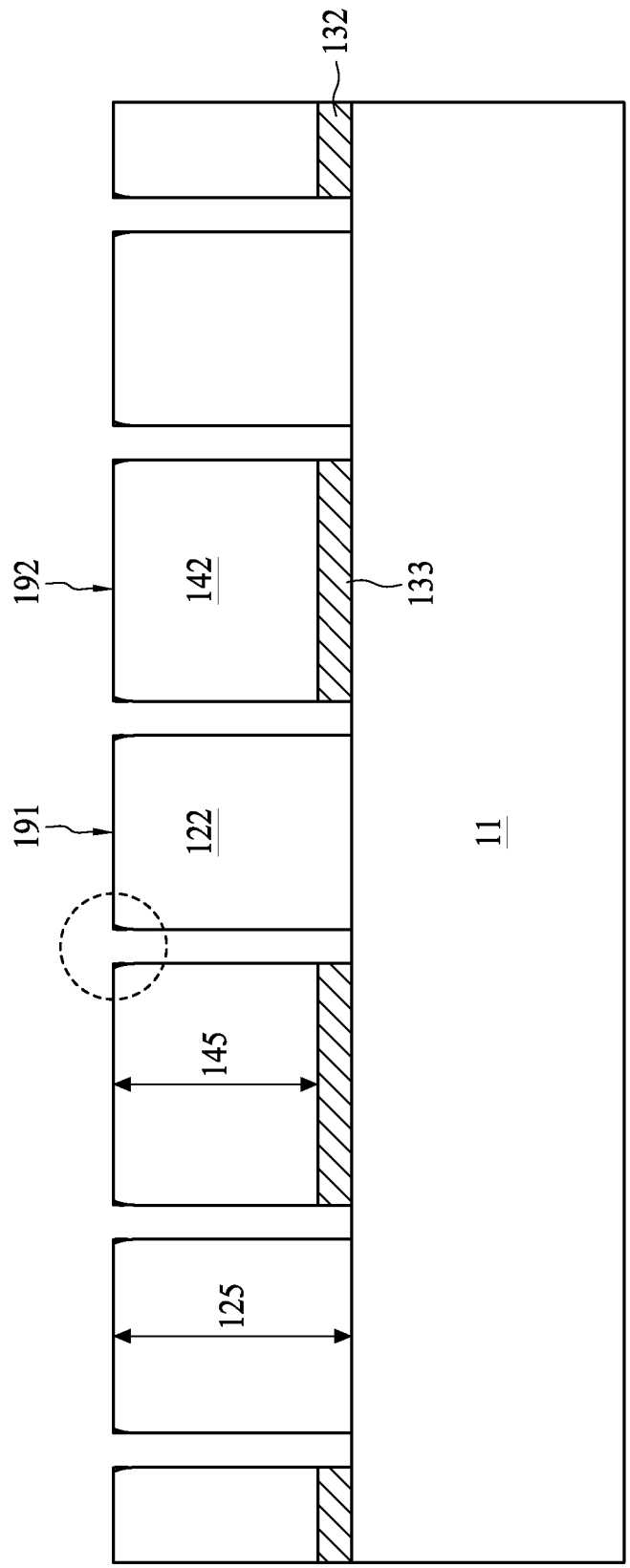
Figure 25:
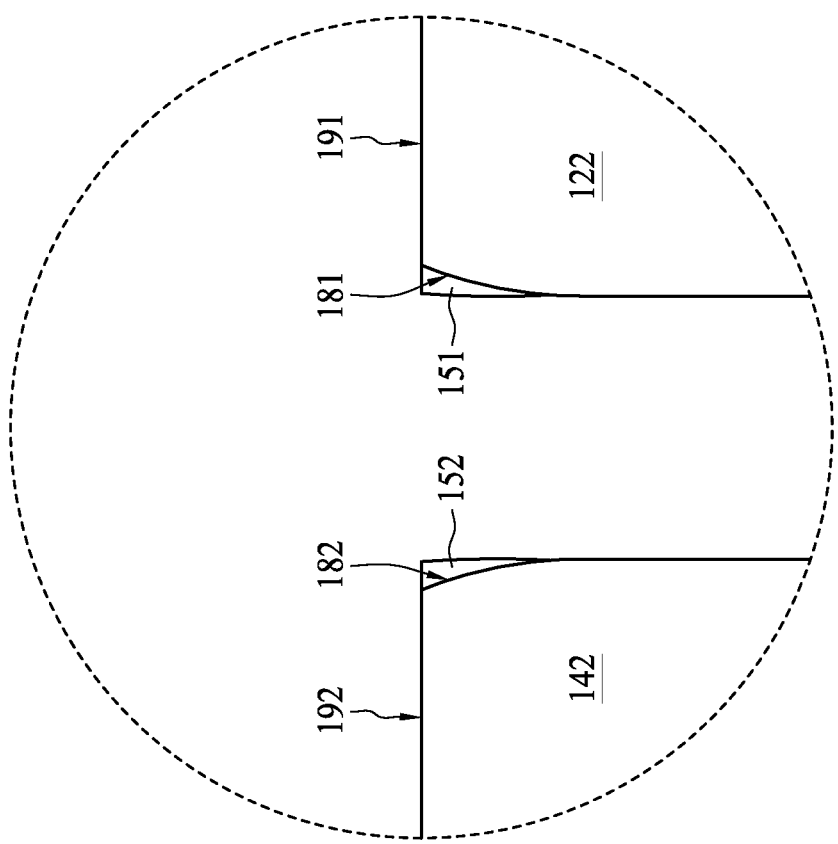
FIG. 25 is an enlarged schematic diagram of a dotted region shown in FIG. 24 in accordance with some embodiments of the present disclosure.

Referring to FIGS. 23 to 25, FIGS. 23 to 24 are schematic cross-sectional diagrams at different stages of the method S1, the method S2 and/or the method S3 in accordance with some embodiments of the present disclosure, and FIG. 25 is an enlarged schematic diagram of a portion of the intermediate structure in a dotted circle indicated in FIG. 24. Operations similar to those illustrated in FIGS. 12 to 13 are sequentially performed on the intermediate structure shown in FIG. 22, and the portions 151 and 152 are formed at the arched surfaces 181 and 182 of the first patterned layer 122 and the second patterned layer 142 as shown in FIGS. 24 and 25. In some embodiments, the portions 151 are attached to an entirety of the arched surface 181 of the first patterned layer 122 left behind after the second etching. In some embodiments, the portions 152 are attached to an entirety of the arched surface 182 of the second patterned layer 142 left behind after the second etching.

In some embodiments, the planar top surface 191 includes different materials, wherein the materials of the first patterned layer 122 and the portion 151 are different. In some embodiments, the planar top surface 192 includes different materials, wherein the materials of the second patterned layer 142 and the portion 152 are different. In some embodiments, the planar top surface 191 includes a uniform material, wherein the materials of the first patterned layer 122 and the portion 151 are same. In some embodiments, the planar top surface 192 includes a uniform material, wherein the materials of the second patterned layer 142 and the portion 152 are same.

Figure 26:
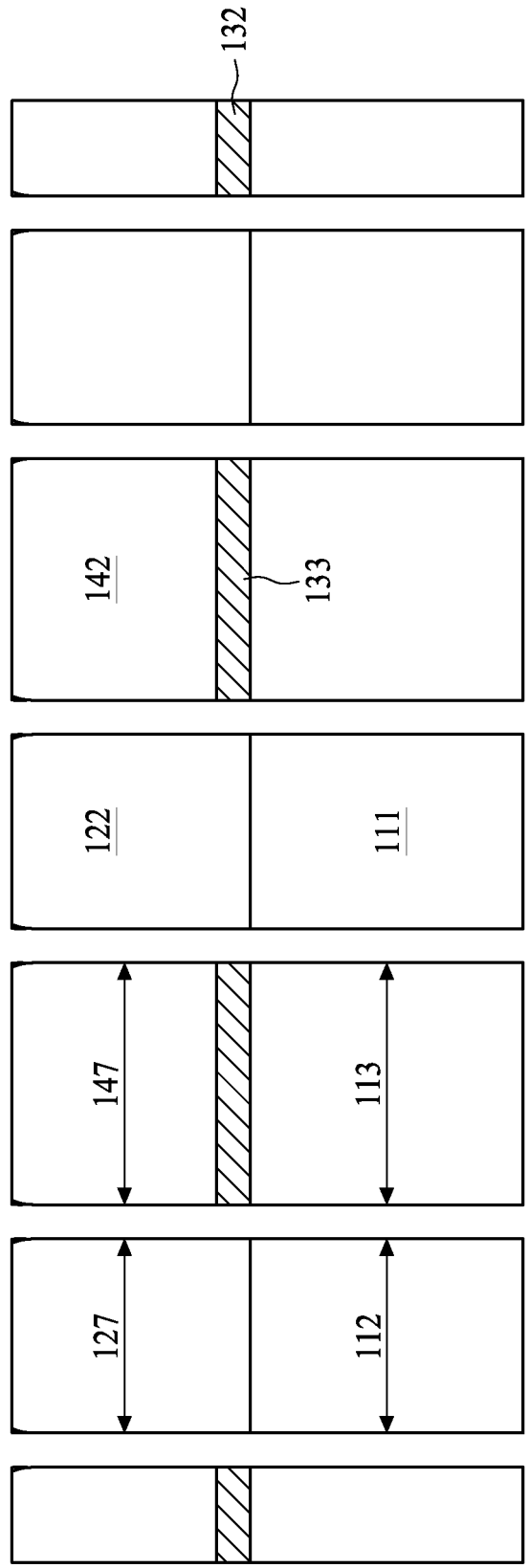
FIGS. 26 to 27 are cross-sectional diagrams of intermediate stages in the formation of a semiconductor structure in accordance with some embodiments of the present disclosure.
Figure 27:
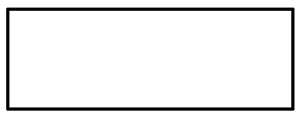
Figure 27:
Figure 27:
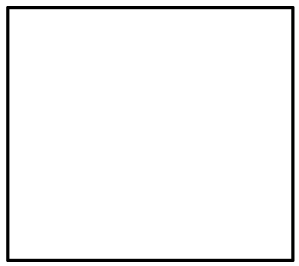
Figure 27:
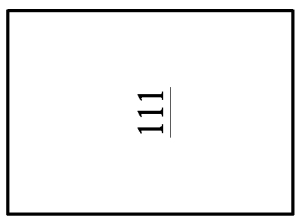
Figure 27:
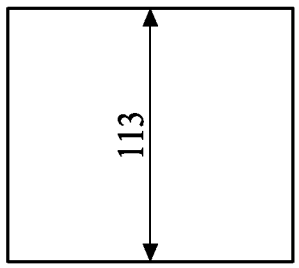
Figure 27:
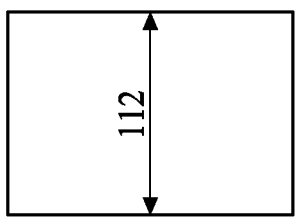
Figure 27:

Referring to FIGS. 26 to 27, FIGS. 26 to 27 are schematic cross-sectional diagrams at different stages of the method S1, the method S2 and/or the method S3 in accordance with some embodiments of the present disclosure. Operations similar to those illustrated in FIGS. 15 to 16 are sequentially performed on the intermediate structure shown in FIG. 24. The width 147 of the second patterned layer 142 is defined by the width 128 of the openings 126 and the thickness 136 of the conformal layer 13 shown in FIG. 19. In some embodiments, the width 147 of the second patterned layer 142 is different from the width 127 of the first patterned layer 142. As a result, the semiconductor structure 20 is formed, and different portions of the patterned substrate 111 may have different widths. In some embodiments, adjacent portions of the patterned substrate 111 respectively include a width 112 different from a width 113, as shown in FIG. 27.

One aspect of the present disclosure provides a method of forming a semiconductor structure. The method includes forming a first patterned layer over a substrate; forming a conformal layer over the first patterned layer; performing a blanket deposition thereby forming a second layer over the conformal layer; performing a first etching until the first patterned layer is exposed, wherein a portion of the second layer over the first patterned layer is removed by the first etching thereby forming a second patterned layer alternately arranged between portions of the first patterned layer; removing vertical portions of the conformal layer; forming a sacrificial layer over the first patterned layer and the second patterned layer, wherein a plurality of air gaps are defined between the first patterned layer and the second patterned layer; and performing a second etching until the plurality of air gaps are exposed.

Another aspect of the present disclosure provides a method of forming a semiconductor structure. The method includes forming a first patterned layer over a substrate; forming a second patterned layer over the substrate and alternately arranged with the first patterned layer; performing an etching thereby forming an arched surface of the first patterned layer and an arched surface of the second patterned layer; forming a sacrificial layer over the first patterned layer and the second patterned layer, wherein a plurality of air gaps are defined by the substrate, the first patterned layer, the second patterned layer and the sacrificial layer; removing the sacrificial layer above the plurality of air gaps, thereby forming a planar top surface of the first patterned layer and a planar top surface of the second patterned layer; and patterning the substrate using the first patterned layer and the second patterned layer as a mask.

Another aspect of the present disclosure provides a method of forming a semiconductor structure. The method includes forming a first oxide layer over a substrate, wherein the first oxide layer includes an opening exposing the substrate; forming a nitride layer in the opening, wherein the nitride layer lines sidewalls of the first oxide layer and a portion of a top surface of the substrate in the opening; forming a second oxide layer in the opening, wherein the second oxide layer is separated from the substrate and the first oxide layer by the nitride layer, and top surfaces of the first oxide layer, the second oxide layer and the nitride layer are coplanar; removing a portion of the nitride layer lining the sidewalls of the first oxide layer, thereby forming a rounded top surface of the second oxide layer and a rounded top surface of the first oxide layer; forming a third oxide layer over the first oxide layer and the second oxide layer without filling a gap between the first oxide layer and the second oxide layer; and performing an etching until the gap is exposed, thereby forming a planar top surface of the first oxide layer and a planar top surface of the second oxide layer.

In conclusion, the application discloses a manufacturing method of a semiconductor structure. A sacrificial layer is formed after removal of vertical portions of a conformal layer. As a result of such removal, material is lost, especially at corners, from a patterned layer, which is used as a mask in subsequent patterning of a substrate. A configuration of the patterned layer is changed after the removal, and a result of the subsequent patterning is affected. The lost material and changed configuration can lead to irregular shapes of the patterned substrate, and therefore cause instabilities and possible defect to subsequent processing. The sacrificial layer can replace the lost material and correct the shifted configuration of the patterned layer, and thus performance of subsequently performed operations can be controlled. Product yield can be therefore improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
    forming a first patterned layer over a substrate;
    forming a second patterned layer over the substrate and alternately arranged with the first patterned layer;
    performing an etching, thereby forming an arched surface of the first patterned layer and an arched surface of the second patterned layer;
    forming a sacrificial layer over the first patterned layer and the second patterned layer, wherein a plurality of air gaps are defined by the substrate, the first patterned layer, the second patterned layer and the sacrificial layer;
    removing the sacrificial layer above the plurality of air gaps, thereby forming a planar top surface of the first patterned layer and a planar top surface of the second patterned layer; and
    patterning the substrate using the first patterned layer and the second patterned layer as a mask.

2. The method of claim 1, wherein the first patterned layer and the second patterned layer include a same dielectric material.

3. The method of claim 1, wherein the first patterned layer or the second patterned layer includes oxide.

4. The method of claim 1, wherein the sacrificial layer includes oxide.

5. The method of claim 1, further comprising:
    forming a conformal layer over the first patterned layer prior to the formation of the second patterned layer.

6. The method of claim 5, wherein the conformal layer includes a dielectric material different from that of the first patterned layer or that of the second patterned layer.

7. The method of claim 5, wherein the conformal layer includes nitride.

8. The method of claim 5, wherein a total thickness of the second patterned layer and the conformal layer is substantially equal to a thickness of the first patterned layer.

9. The method of claim 5, wherein a thickness of the conformal layer is in a range of 5 to 30 nanometers.

10. The method of claim 1, wherein a thickness of the second patterned layer is less than a thickness of the first patterned layer.

11. The method of claim 1, wherein a pattern of the first patterned layer and the second patterned layer is transferred to a topmost layer of the substrate.

12. The method of claim 1, wherein a thickness of the first patterned layer is in a range of 50 to 300 nanometers.

13. The method of claim 1, wherein a width of one of the plurality of air gaps is in a range of 5 to 30 nanometers.

14. The method of claim 1, wherein the sacrificial layer is in contact with an entirety of the arched surfaces of the first patterned layer and the arched surfaces of the second patterned layer.

15. A method of manufacturing a semiconductor structure, comprising:
    forming a first oxide layer over a substrate, wherein the first oxide layer includes an opening exposing the substrate;
    forming a nitride layer in the opening, wherein the nitride layer lines sidewalls of the first oxide layer and a portion of a top surface of the substrate in the opening;
    forming a second oxide layer in the opening, wherein the second oxide layer is separated from the substrate and the first oxide layer by the nitride layer, and top surfaces of the first oxide layer, the second oxide layer and the nitride layer are coplanar;
    removing a portion of the nitride layer lining the sidewalls of the first oxide layer, thereby forming a rounded top surface of the second oxide layer and a rounded top surface of the first oxide layer;
    forming a third oxide layer over the first oxide layer and the second oxide layer without filling a gap between the first oxide layer and the second oxide layer; and
    performing an etching until an exposure of the gap, thereby forming a planar top surface of the first oxide layer and a planar top surface of the second oxide layer.

16. The method of claim 15, wherein the removal of the portion of the nitride layer includes a directional dry etch.

17. The method of claim 16, wherein the gap is formed in place of the portion of the nitride layer removed by the directional dry etch.

18. The method of claim 15, wherein the substrate is exposed through the gap between the first oxide layer and the second oxide layer.

19. The method of claim 15, further comprising:
 removing a portion of a topmost layer of the substrate exposed in the gap.

20. The method of claim 19, wherein a material of the topmost layer is different from that of the first oxide layer or that of the second oxide layer.

\* \* \* \* \*